(12) United States Patent
Shimbo

(10) Patent No.: US 12,402,409 B2
(45) Date of Patent: *Aug. 26, 2025

(54) SEMICONDUCTOR INTEGRATED CIRCUIT DEVICE

(71) Applicant: SOCIONEXT INC., Kanagawa (JP)

(72) Inventor: Hiroyuki Shimbo, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 160 days.

This patent is subject to a terminal disclaimer.

(21) Appl. No.: 18/234,678

(22) Filed: Aug. 16, 2023

(65) Prior Publication Data

US 2023/0395604 A1    Dec. 7, 2023

Related U.S. Application Data

(63) Continuation of application No. 17/887,913, filed on Aug. 15, 2022, now Pat. No. 11,764,224, which is a
(Continued)

(30) Foreign Application Priority Data

Aug. 1, 2016    (JP) .................................. 2016-151125

(51) Int. Cl.
*H10D 84/00*    (2025.01)
*H10D 62/10*    (2025.01)
(Continued)

(52) U.S. Cl.
CPC ........... *H10D 84/907* (2025.01); *H10D 62/10* (2025.01); *H10D 84/85* (2025.01); *H10D 89/10* (2025.01);
(Continued)

(58) Field of Classification Search
CPC ............... H01L 27/0207; H01L 27/092; H01L 27/11807; H01L 29/0673; H01L 29/42396;
(Continued)

(56) References Cited

U.S. PATENT DOCUMENTS 10,879,270 B2    12/2020  Shimbo
11,450,688 B2     9/2022  Shimbo
(Continued)

FOREIGN PATENT DOCUMENTS

CN    104282655 A    1/2015
CN    105531813 A    4/2016
(Continued)

OTHER PUBLICATIONS

S. Bangsaruntip, et al. "High performance and highly uniform gate-all-around silicon nanowire MOSFETs with wire size dependent scaling", Electron Devices Meeting (IEDM), 2009 IEEE International, Jan. 2010, pp. 297-300.
(Continued)

*Primary Examiner* — Reema Patel
(74) *Attorney, Agent, or Firm* — Rimon P.C.

(57) ABSTRACT

Provided is a semiconductor integrated circuit device including a nanowire field effect transistor (FET) and having a layout configuration effective for making manufacturing the device easy. A standard cell having no logical function is disposed adjacent to a standard cell having a logical function. The standard cell includes nanowire FETs having nanowires and pads. The standard cell further includes dummy pads, which have no contribution to a logical function of a circuit.

18 Claims, 16 Drawing Sheets

Related U.S. Application Data continuation of application No. 17/104,563, filed on Nov. 25, 2020, now Pat. No. 11,450,688, which is a continuation of application No. 16/262,183, filed on Jan. 30, 2019, now Pat. No. 10,879,270, which is a continuation of application No. PCT/JP2017/024918, filed on Jul. 7, 2017.

(51) Int. Cl.
| | | |
|---|---|---|
| *H10D 84/85* | (2025.01) | |
| *H10D 84/90* | (2025.01) | |
| *H10D 89/10* | (2025.01) | |
| *H10D 84/01* | (2025.01) | |
| *H10D 84/03* | (2025.01) | |

(52) U.S. Cl.
CPC ....... *H10D 84/0186* (2025.01); *H10D 84/038* (2025.01); *H10D 84/912* (2025.01); *H10D 84/961* (2025.01); *H10D 84/964* (2025.01); *H10D 84/966* (2025.01)

(58) Field of Classification Search
CPC .... H01L 29/775; H10D 84/85; H10D 84/907; H10D 89/10; H10D 30/6735; H10D 62/121

See application file for complete search history.

(56) References Cited

U.S. PATENT DOCUMENTS

| | | | | |
|---|---|---|---|---|
| 11,764,224 | B2* | 9/2023 | Shimbo | H10D 62/10 257/204 |
| 2010/0044755 | A1 | 2/2010 | Tsuda et al. | |
| 2011/0057163 | A1 | 3/2011 | Liu et al. | |
| 2015/0014775 | A1 | 1/2015 | Seo et al. | |
| 2016/0079358 | A1 | 3/2016 | Doornbos et al. | |
| 2016/0190138 | A1 | 6/2016 | Shimbo | |

FOREIGN PATENT DOCUMENTS

| | | |
|---|---|---|
| JP | 2015-015502 A | 1/2015 |
| JP | 2015-019067 A | 1/2015 |
| WO | 2009/150999 A1 | 12/2009 |
| WO | 2015/033490 A1 | 3/2015 |

OTHER PUBLICATIONS

I. Lauer, et al. "Si Nanowire CMOS Fabricated with Minimal Deviation from RMG Fin FET Technolody Showing Record Performance", 2015 Symposium on VLSI Technology Digest of Technical Papers (Abstract).

International Search Report issued in Application No. PCT/JP2017/024918 dated Sep. 26, 2017, with English translation.

Written Opinion issued in Application No. PCT/JP2017/024918 dated Sep. 26, 2017, with partial English translation.

Non-Final Office Action issued in U.S. Appl. No. 16/262,183 dated Mar. 27, 2020.

Notice of Allowance issued in U.S. Appl. No. 16/262,183 dated Aug. 26, 2020.

Non-Final Office Action issued in U.S. Appl. No. 17/104,563 dated Mar. 24, 2022.

Notice of Allowance issued in U.S. Appl. No. 17/104,563 dated May 24, 2022.

Chinese Office Action issued in Chinese Application No. 201780045986.6 on Sep. 5, 2022, with partial English translation.

Notice of Allowance issued in U.S. Appl. No. 17/887,913, dated May 24, 2023.

Non-Final Office Action issued in U.S. Appl. No. 17/887,913, dated Mar. 2, 2023.

* cited by examiner

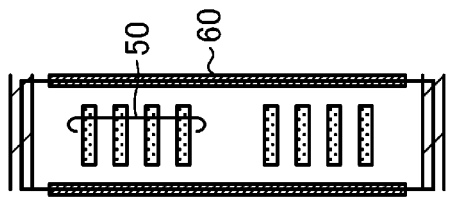
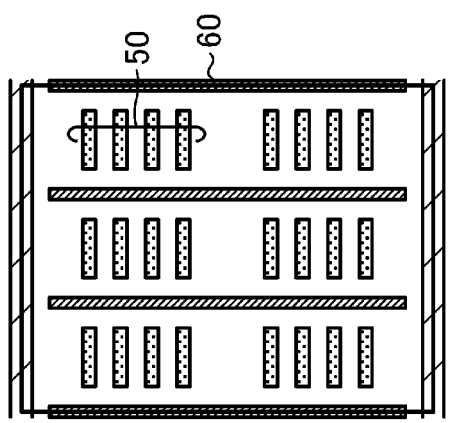
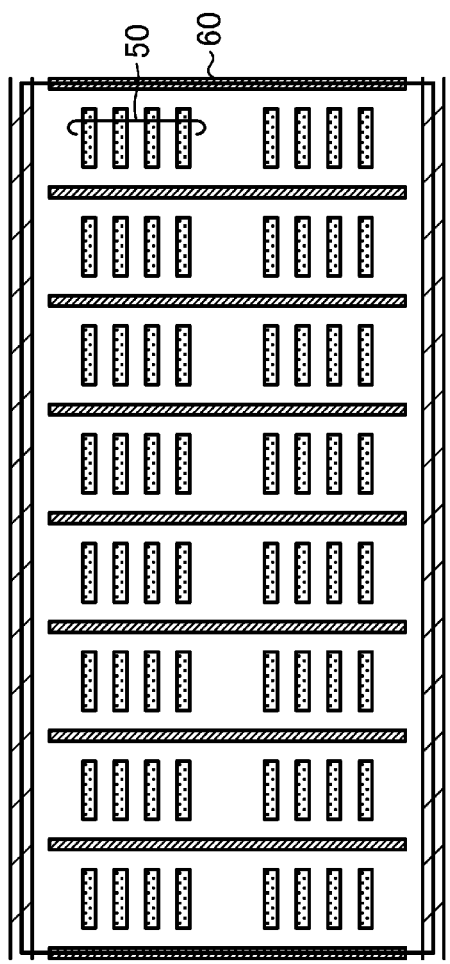

- dummy gate
- LI
- M1
- dummy pad
- CO

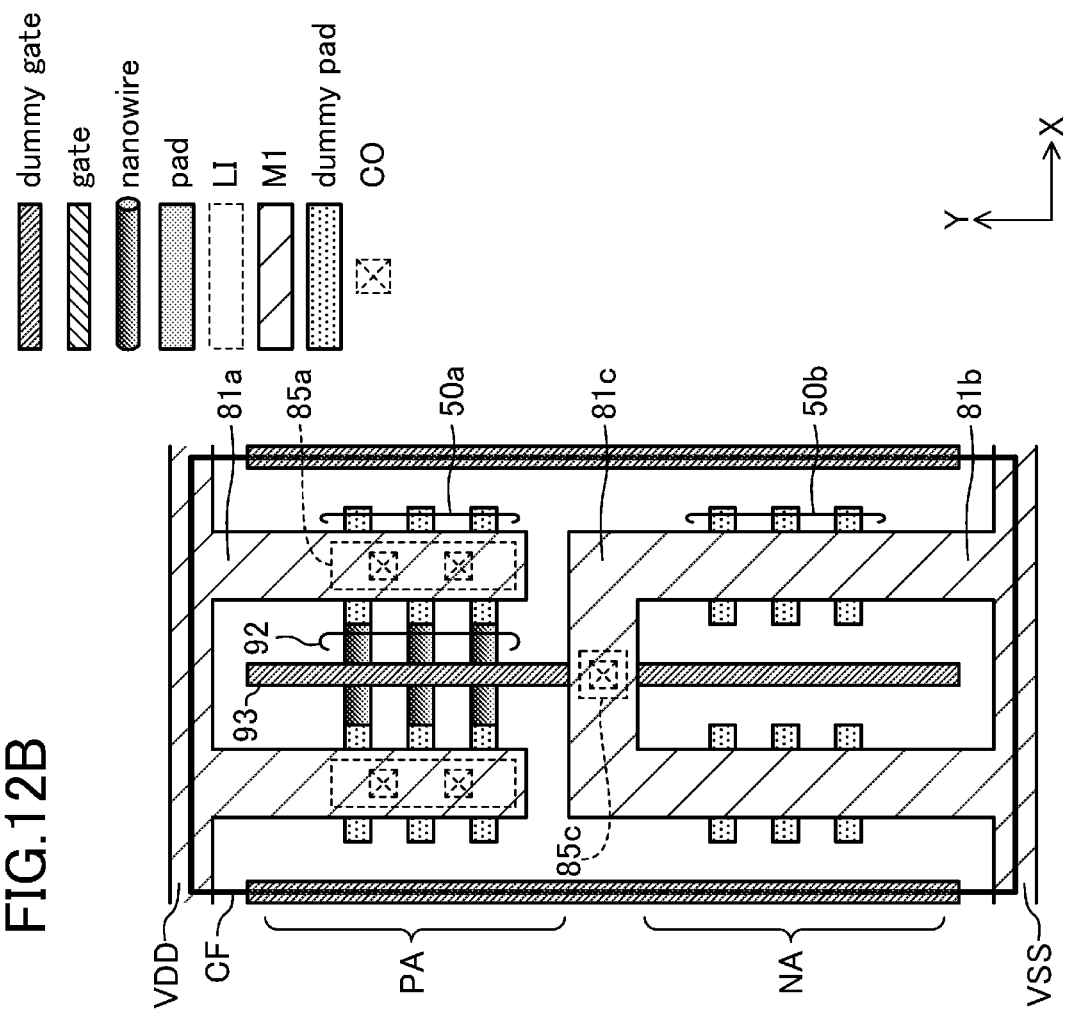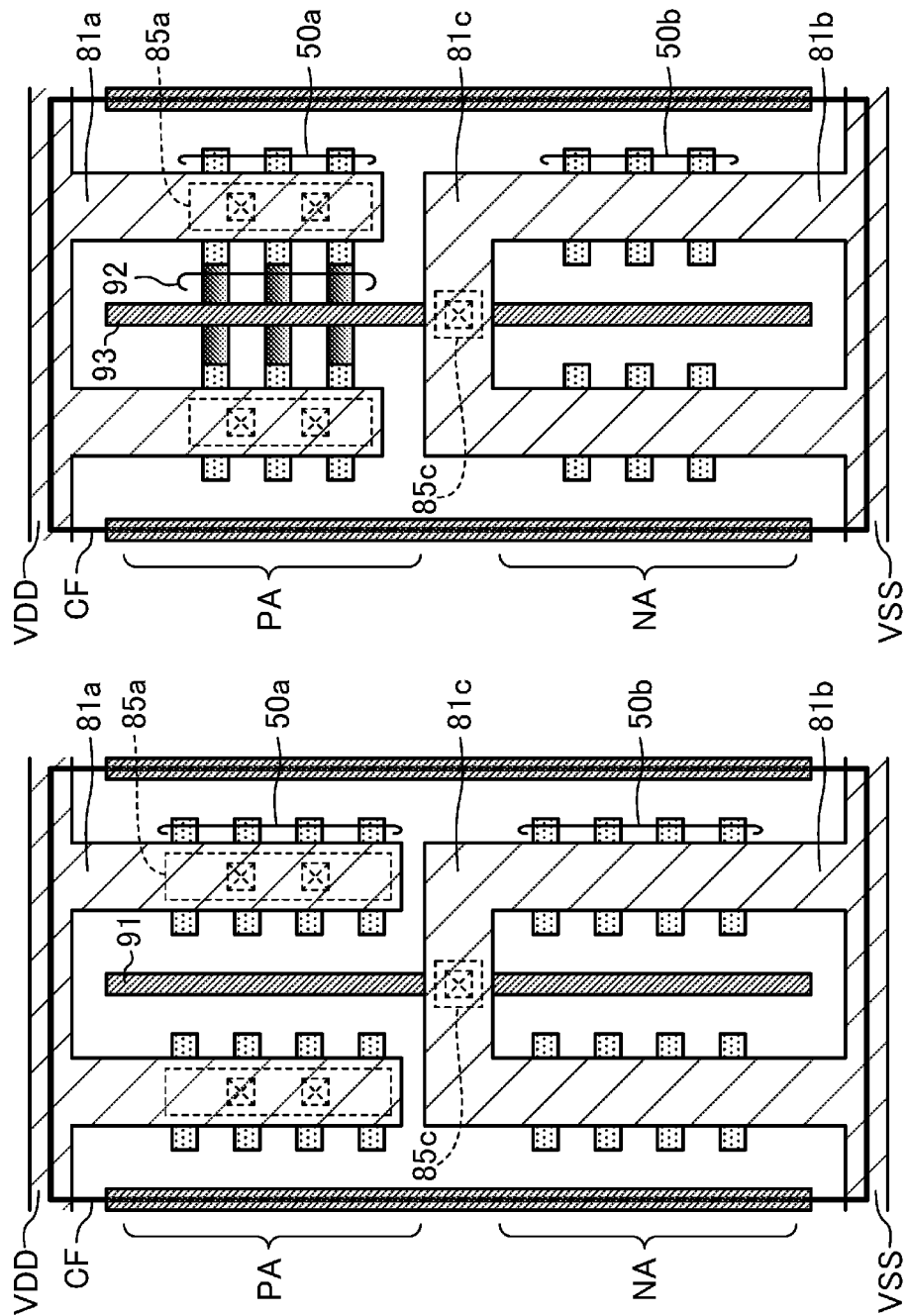

SEMICONDUCTOR INTEGRATED CIRCUIT DEVICE

CROSS-REFERENCE TO RELATED APPLICATIONS

This is a continuation of U.S. application Ser. No. 17/887,913, filed Aug. 15, 2022, now U.S. Pat. No. 11,764,224, which is a continuation of U.S. application Ser. No. 17/104,563, filed Nov. 25, 2020, now U.S. Pat. No. 11,450,688, which is a continuation U.S. application Ser. No. 16/262,183, now U.S. Pat. No. 10,879,270, filed Jan. 30, 2019, which is a continuation of International Application No. PCT/JP2017/24918 filed on Jul. 7, 2017, which claims priority to Japanese Patent Application No. 2016-151125 filed on Aug. 1, 2016. The entire disclosures of these applications are incorporated by reference herein.

BACKGROUND

The present disclosure relates to a semiconductor integrated circuit device including a standard cell (hereinafter, also referred to simply as a cell as appropriate) including a nanowire field effect transistor (FET).

A standard cell design has been known as a method of forming a semiconductor integrated circuit on a semiconductor substrate. The standard cell design refers to a method of designing a large-scale integrated circuit (LSI) chip by providing in advance, as standard cells, unit logic elements having particular logical functions (for example, an inverter, a latch, a flip-flop, and a full adder), laying out those standard cells on a semiconductor substrate, and connecting those standard cells together through an interconnect.

Reducing a gate length (scaling) of transistors that are a basic element of the LSI have achieved more integrated transistors, reduced an operating voltage, and improved an operating rate. However, recently, off-current has been increased due to excessive scaling, and power has been consumed more and more due to the increase in off-current, which are problems. In order to solve such problems, three-dimensional transistors having a three-dimensional structure to which a change is made from a conventional two-dimensional structure have been actively researched. As one technique, nanowire FETs draw attention.

Examples of a method for manufacturing nanowire FETs are disclosed in S. Bangsaruntip, et al. "High performance and highly uniform gate-all-around silicon nanowire MOSFETs with wire size dependent scaling", Electron Devices Meeting (IEDM), 2009 IEEE International and Isaac Laucer, et al. "Si Nanowire CMOS Fabricated with Minimal Deviation from RMG Fin FET Technology Showing Record Performance", 2015 Symposium on VLSI Technology Digest of Technical Papers.

SUMMARY

So far, neither a structure of a standard cell with a nanowire FET nor a layout of a semiconductor integrated circuit device including such a nanowire FET has been specifically studied.

The present disclosure relates to a semiconductor integrated circuit device including a nanowire FET, and provides a layout configuration effective for making manufacturing the device easy.

A first aspect of the present disclosure is directed to a semiconductor integrated circuit device. The semiconductor integrated circuit device includes: a first standard cell including a nanowire field effect transistor (FET) and having a logical function; and a second standard cell disposed adjacent to the first standard cell in a first direction and having no logical function. The nanowire FET includes: a nanowire extending in the first direction, the nanowire being a single nanowire or including a plurality of parallelly arranged nanowires; and a pair of pads that are respectively arranged at both ends of the nanowire in the first direction, each have a lower surface below a lower surface of the nanowire, and are each connected to the nanowire. The second standard cell includes a dummy pad having no contribution to a logical function of a circuit.

According to this aspect, the second standard cell having no logical function is disposed adjacent to the first standard cell having a logical function. The first standard cell includes the nanowire FET having the nanowires and the pads, whereas the second standard cell includes the dummy pad, which has no contribution to the logical function of the circuit. Consequently, in the first and second standard cells, the pads and the dummy pads can be regularly arranged. This can reduce process-induced variations in the semiconductor integrated circuit device, and improve yield.

The present disclosure can reduce process-induced variations and variations in performance and improve yield in a semiconductor integrated circuit device including a nanowire FET.

BRIEF DESCRIPTION OF THE DRAWINGS

FIGS. 4A to 4C are plan views of filter cells having different cell widths;

FIG. 9A is a plan view of a layout configuration of the capacitance cell; and FIG. 9B is a cross-sectional view of the capacitance cell;

FIG. 11A is a plan view of a layout configuration of the capacitance cell; and FIG. 11B is a cross-sectional view of the capacitance cell;

FIGS. 12A and 12B are plan views of a further layout configuration of the capacitance cell including the dummy pads;

DETAILED DESCRIPTION

Embodiments will be described with reference to the drawings. In the following description of the embodiment, it is assumed that a semiconductor integrated circuit device includes a plurality of standard cells, at least some of which include a nanowire field effect transistor (FET).

Figure 15:
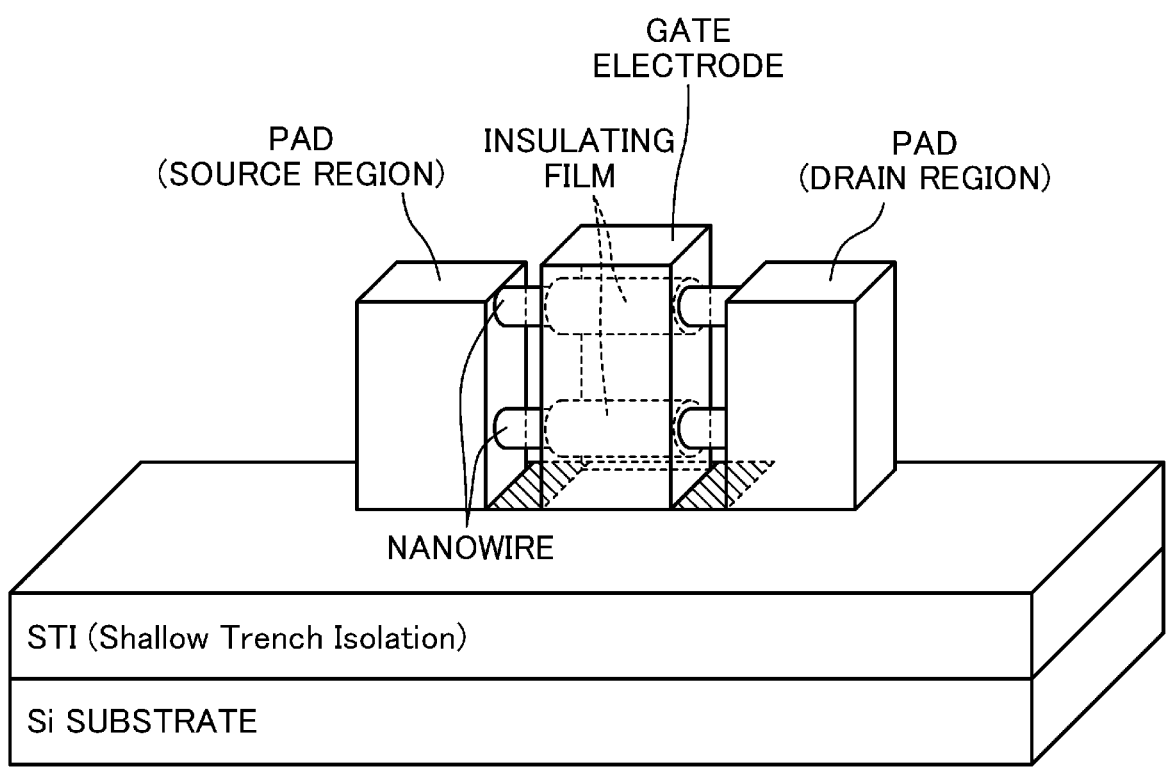
FIG. 15 schematically illustrates a basic configuration for the nanowire FET.

FIG. 15 is a schematic diagram of a basic structure example of the nanowire FET (also referred to as a nanowire gate all around (GAA) FET). The nanowire FET is a FET including thin wires (nanowires) through each of which a current flows. The nanowires are made of, e.g., silicon. As illustrated in FIG. 15, the nanowires are formed so as to extend horizontally above a substrate, i.e., extend parallel to the substrate, and each have both ends respectively connected to elements serving as source and drain regions of the nanowire FET. In this specification, in a nanowire FET, elements connected to both ends of a nanowire and serving as source and drain regions of the nanowire FET are each called a pad. In FIG. 15, a shallow trench isolation (STI) is formed on a Si substrate. However, the Si substrate is exposed in an (hatched) area under the nanowire. The hatched area may actually be covered with, e.g., a thermal oxide film. In FIG. 15, such a film is omitted for the sake of simplicity.

The nanowire is surrounded by a gate electrode comprised of, e.g., polysilicon via an insulating film such as a silicon oxide film. The pads and the gate electrode are formed on the substrate surface. With this configuration, all of upper, lower, and both side portions of a channel region of the nanowire are surrounded by the gate electrode, and thus, the electric field is evenly applied to the channel region, thus improving switching characteristics of the FET.

Although at least portions of the pads connected to the nanowire serve as the source/drain regions, portions of the pads below the portions connected to the nanowire do not necessarily serve as the source/drain regions. Portions of the nanowire (portions thereof not surrounded by the gate electrode) may serve as the source/drain regions.

In FIG. 15, two nanowires are arranged in the vertical direction, i.e., a direction perpendicular to the substrate. However, the number of the nanowires arranged in the vertical direction is not limited to two. Alternatively, one or three or more nanowires may be arranged in the vertical direction. In FIG. 15, the upper end of the uppermost nanowire is at the same height as the upper end of the pad. However, the upper ends of these components do not necessarily have to be at the height, and the upper ends of the pads may be situated above the upper end of the uppermost nanowire.

Figure 16:
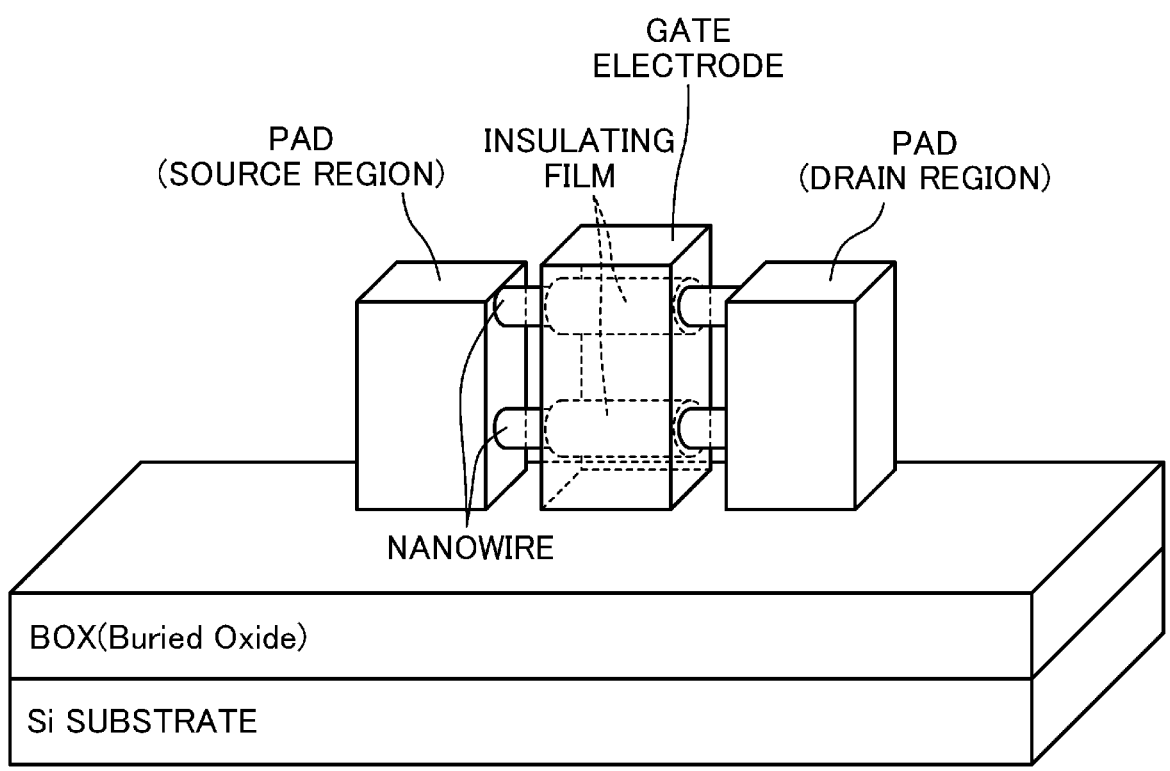
FIG. 16 schematically illustrates a basic configuration for the nanowire FET.

As shown in FIG. 16, in some cases, a buried oxide (BOX) is formed on the upper surface of the substrate, and the nanowire FET is formed on the BOX.

EMBODIMENT

Figure 1:
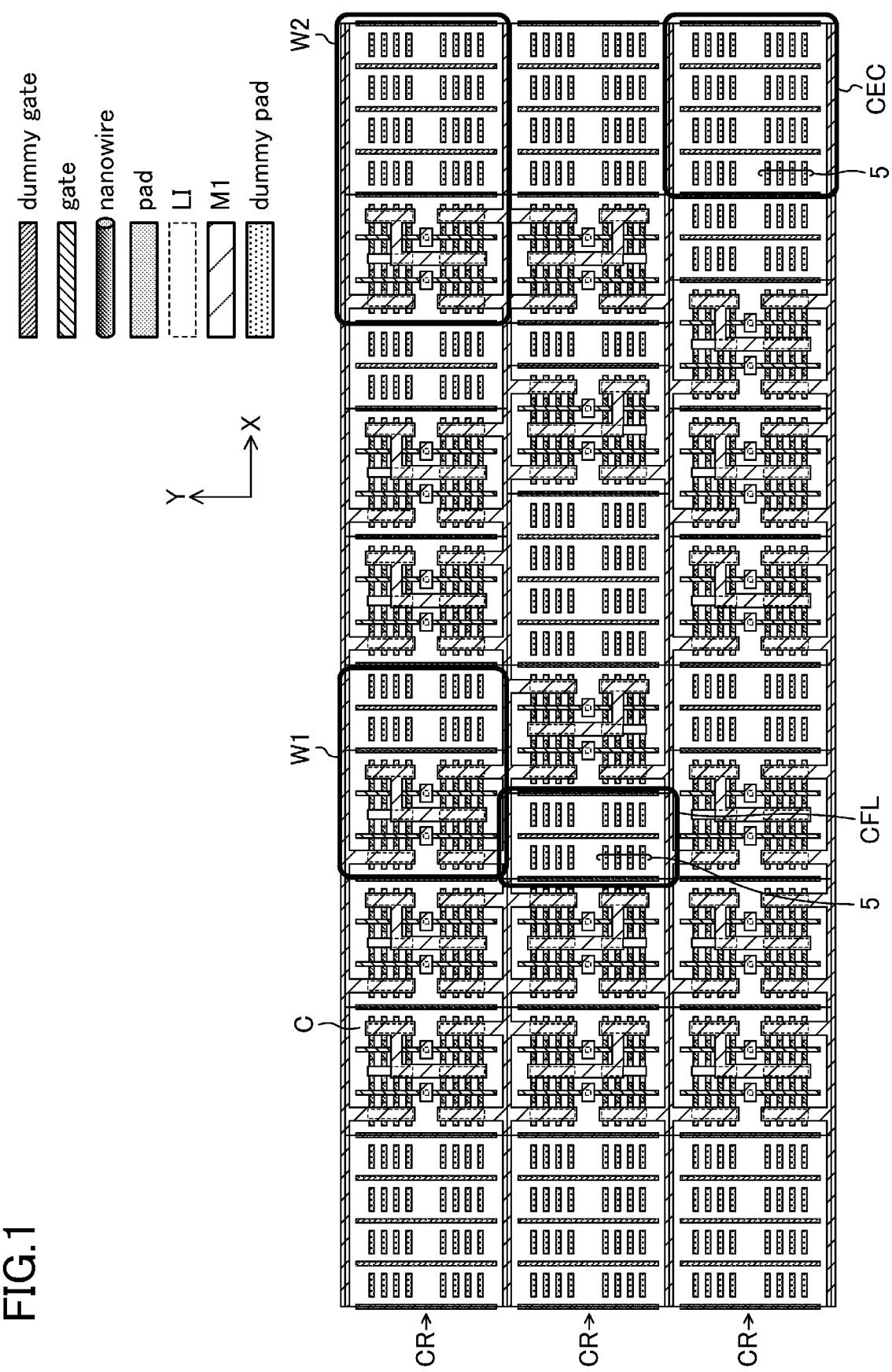
FIG. 1 is a plan view of a layout example of a circuit block included in a semiconductor integrated circuit device according to an embodiment.

FIG. 1 is a plan view of a layout example of a circuit block included in a semiconductor integrated circuit device according to an embodiment. In the layout of FIG. 1, a plurality of cells C arranged in an X direction (the lateral direction of the drawing corresponding to a first direction) form a cell row CR. A plurality of cell rows are arranged in a Y direction (the longitudinal direction of the drawing corresponding to a second direction). The cells C include a filler cell CFL and a cell-row-terminating cell (also referred to as an End Cap cell) CEC in addition to cells having logical functions such as a NAND gate and a NOR gate (hereinafter, referred to as logical cells as appropriate).

Here, the "filler cell" refers to a cell having no logical function, having no contribution to a logical function of the circuit block, and disposed between the logical cells. The "cell-row-terminating cell" refers to a cell having no logical function, having no contribution to the logical function of the circuit block, and used to terminate the cell row. Arranging the cell-row-terminating cell allows a well region in the cell row to be sufficiently extended in the X direction. With this configuration, the transistors of the logical cells positioned inside the cell-row-terminating cell are located away from a well end, and the transistors near the well end can be prevented from having varying characteristics.

In the present embodiment, the filler cell CFL and the cell-row-terminating cell CEC each include dummy pads 5. Here, the "dummy pads" each refer to a pad having no contribution to the logical function of a circuit, i.e., element having a structure similar to that of the pads included in the nanowire FET and having no contribution to the logical function of the circuit block.

FIG. 1 illustrates the logical cells that are all the same in size and layout. However, an actual layout is not limited to this example, and any logical cell may be disposed.

In the present embodiment, a metal interconnect (M1), pads (pad), and gate lines (gate) are connected together via local interconnects (LI) and contacts. However, FIG. 1 does not illustrate the contacts.

Configuration of Filler Cell

Figure 2:
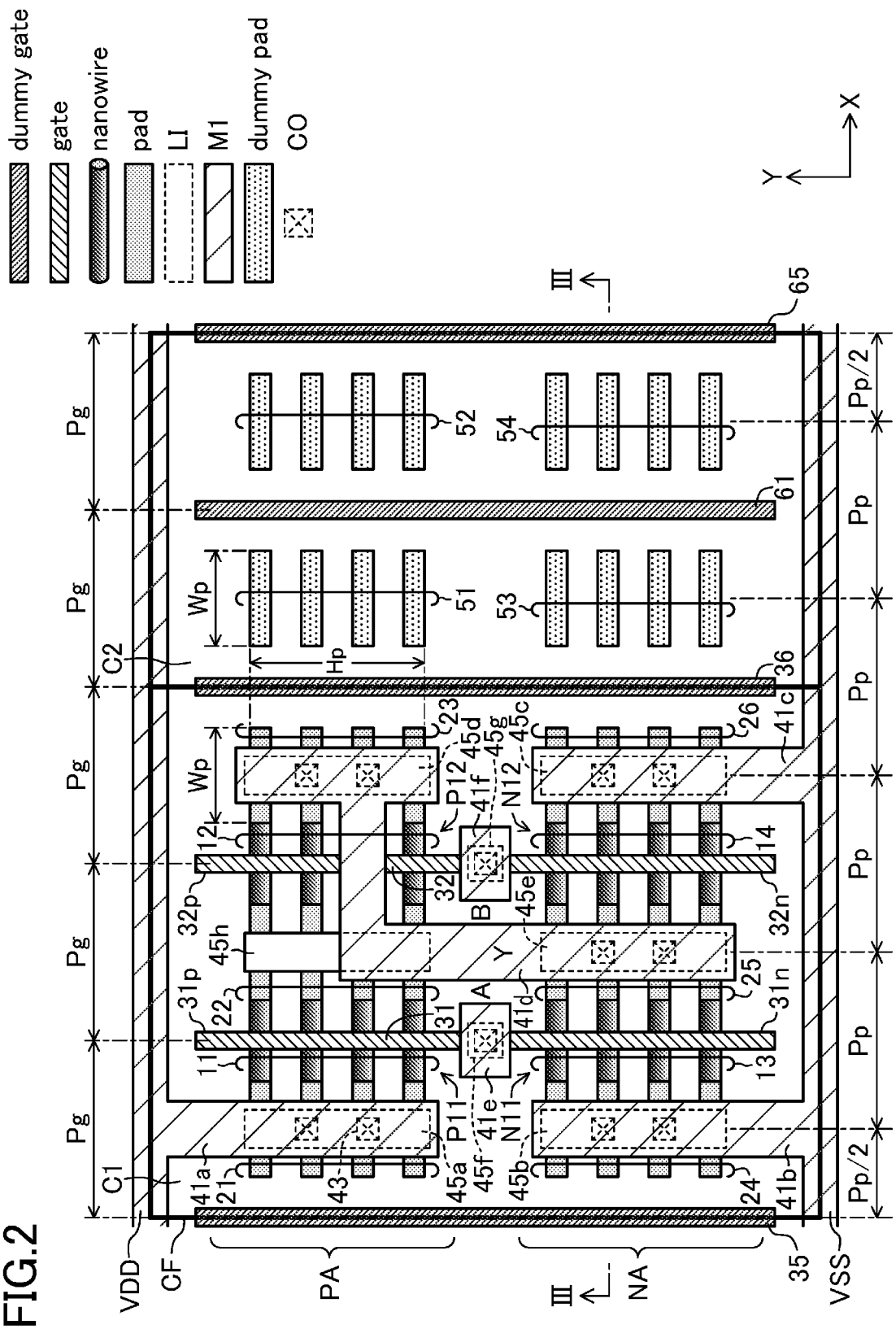
FIG. 2 is a plan view of a layout configuration of standard cells in the embodiment.

FIG. 2 is an enlarged view of a portion W1 of FIG. 1, and is a plan view of a layout configuration of standard cells in the present embodiment. In FIG. 2, a standard cell C1 includes nanowire FETs and has a logical function (here, 2-input NOR). A standard cell C2 is a filler cell having no logical function, and is disposed adjacent to the standard cell C1 in the X direction. In the standard cells C1 and C2, a p-type transistor area PA and an n-type transistor area NA are arranged in the Y direction. The metal interconnect layer M1 includes an interconnect VDD that extends in the X direction at upper sides of the standard cells C1 and C2 and supplies a power supply potential VDD, and an interconnect VSS that extends in the X direction at lower sides of the standard cells C1 and C2 and supplies a ground potential VSS.

The p-type transistor area PA of the standard cell C1 is provided with p-type nanowire FETs P11 and P12, and the n-type transistor area NA thereof is provided with n-type nanowire transistors N11 and N12. The nanowire FETs P11 and P12 are connected together in series, whereas the nanowire transistors N11 and N12 are connected together in parallel. The nanowire FETs P11, P12, N11, and N12 are respectively provided with a plurality of groups of nanowires 11, 12, 13, 14. The groups of nanowires 11, 12, 13, 14 each include a plurality of nanowires extending in the X direction and parallelly arranged. Here, the groups of nanowires 11, 12, 13, 14 each include four nanowires arranged in the Y direction. As will be described below, the groups of nanowires 11, 12, 13, 14 further each include two nanowires in the vertical direction, i.e., the direction perpendicular to the substrate, and each include eight nanowires in total. Each of the nanowires 11, 12, 13, 14 has a cylindrical shape, extends horizontally above the substrate, i.e., parallel to the substrate, and is comprised of, e.g., silicon. The standard cell C1 is provided with a group of pads 21, a group of pads 22, a group of pads 23, a group of pads 24, a group of pads 25, and a group of pads 26 each connected to an associated one of the groups of the nanowires 11, 12, 13, 14. P-type impurities are introduced into at least portions of the pads 21, 22, 23 connected to the nanowires 11, 12 and serving as source/drain regions of the nanowire FETs P11 and P12. N-type impurities are introduced into at least portions of the pads 24, 25, 26 connected to the nanowires 13, 14 and serving as source/drain regions of the nanowire FETs N11 and N12.

Here, the groups of the pads 21, 22, 23, 24, 25, 26 each include four pads separately arranged in the Y direction. The separately arranged four pads 21 area each connected to an associated one of the four nanowires 11 arranged in the Y direction. The separately arranged four pads 22 are each connected to an associated one of the four nanowires 11 arranged in the Y direction, and are each connected to an associated one of the four nanowires 12 arranged in the Y direction. The separately arranged four pads 23 are each connected to an associated one of the four nanowires 12 arranged in the Y direction. The separately arranged four pads 24 are each connected to an associated one of the four nanowires 13 arranged in the Y direction. The separately arranged four pads 25 are each connected to an associated one of the four nanowires 13 arranged in the Y direction, and are each connected to an associated one of the four nanowires 14 arranged in the Y direction. The separately arranged four pads 26 are each connected to an associated one of the four nanowires 14 arranged in the Y direction.

The nanowire FETs P11 and P12 connected together in series share the pads 22. That is to say, the nanowire FET P11 includes the pads 21, 22 connected to the nanowires 11, and the nanowire FET P12 includes the pads 22, 23 connected to the nanowires 12. The nanowire FETs N11 and N12 connected together in parallel share the pads 25. That is to say, the nanowire FET N11 includes the pads 24, 25 connected to the nanowires 13, and the nanowire FET N12 includes the pads 25, 26 connected to the nanowires 14.

The standard cell C1 is provided with two gate lines 31 and 32 which extend linearly along the Y direction. The gate line 31 is comprised of a gate electrode 31p in the nanowire FET P11 and a gate electrode 31n in the nanowire FET N11 which are integrally formed with each other, and surrounds peripheries of the nanowires 11 and 13 within predetermined ranges of the nanowires 11 and 13 in the X direction. The gate line 32 is comprised of a gate electrode 32p in the nanowire FET P12 and a gate electrode 32n in the nanowire FET N12 which are integrally formed with each other, and surrounds peripheries of the nanowires 12 and 14 within predetermined ranges of the nanowires 12 and 14 in the X direction. Lateral sides of a cell frame CF of the standard cell 1 are respectively provided with dummy gate lines 35 and 36 extending along the Y direction.

The metal interconnect layer M1 further includes interconnects 41a to 41f. The interconnect 41a is formed so as to extend downward from the interconnect VDD along the Y direction, and is connected to the pads 21 through a local interconnect 45a. The interconnect 41b is formed so as to extend upward from the interconnect VSS along the Y direction, and is connected to the pads 24 through a local interconnect 45b. The interconnect 41c is formed so as to extend upward from the interconnect VSS along the Y direction, and is connected to the pads 26 through a local interconnect 45c. The interconnect 41d connects the pads 23, 25 together, is connected to the pads 23 through a local interconnect 45d, and is connected to the pads 25 through a local interconnect 45e. The interconnect 41e is connected to the gate line 31 through a local interconnect 45f. The interconnect 41f is connected to the gate line 32 through a local interconnect 45g. The interconnects 41d, 41e, and 41f are respectively associated with an output Y, an input A, and an input B in the 2-input NOR circuit. A local interconnect 45h is disposed on the pads 22. Although the local interconnect 45h is connected to the pads 22, it is not connected to any interconnect of the metal interconnect layer M1.

The metallic interconnects 41a to 41f are each connected to an associated one or ones of the pads 21, 23, 24, 25, 26 and the gate lines 31 and 32 through associated ones of the local interconnects 45a, 45b, 45c, 45d, 45e, 45f, and 45g and contacts 43. Alternatively, the metallic interconnects may be connected to the pads and the gate lines only through the local interconnects, not through the contacts, or may be connected to the pads and the gate lines only through the contacts, not through the local interconnects.

The p-type transistor area PA of the standard cell C2 is provided with a group of dummy pads 51 and a group of dummy pads 52, and the n-type transistor area NA thereof is provided with a group of dummy pads 53 and a group of dummy pads 54. Here, the groups of dummy pads 51, 52, 53, 54 each include four pads separately arranged in the Y direction. P-type impurities are introduced into the groups of dummy pads 51, 52 similarly to the groups of pads 21, 22, 23, whereas n-type impurities are introduced into the groups of dummy pads 53, 54 similarly to the groups of pads 24, 25, 26. A dummy gate line 61 extending in the Y direction is disposed between the groups of dummy pads 51, 53 and the groups of dummy pads 52, 54. A dummy gate line 65 extending in the Y direction is disposed on a side of the standard cell C2 remote from the standard cell C1.

Figure 3:
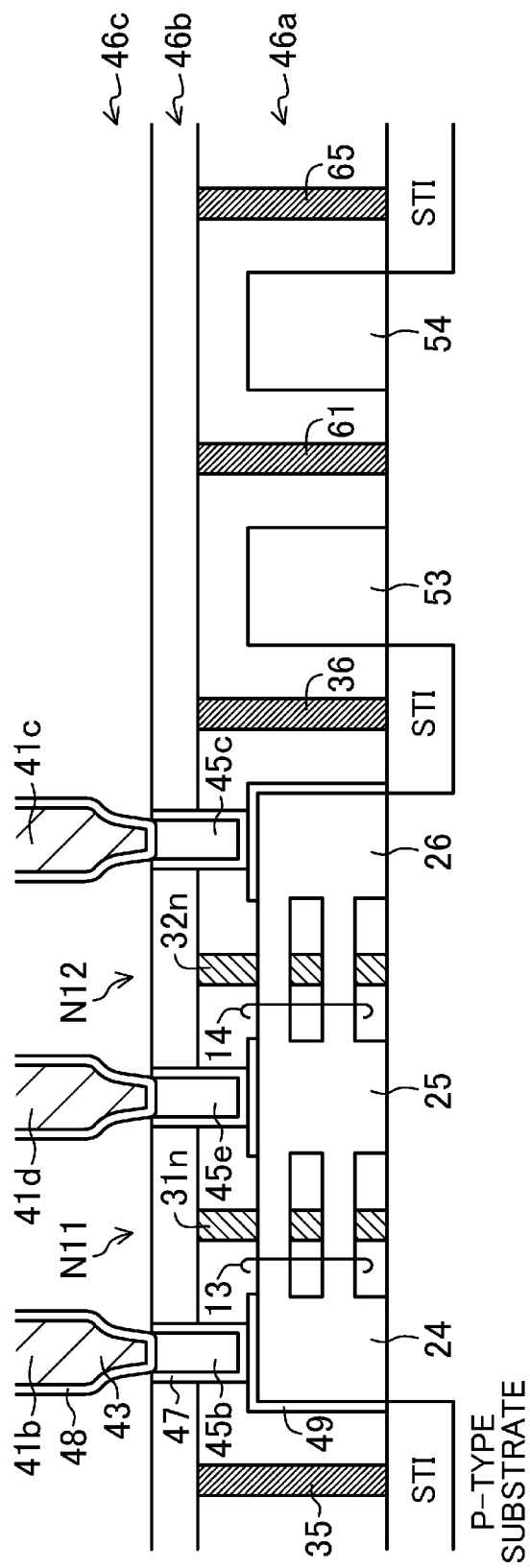
FIG. 3 is a cross-sectional view of the standard cells of FIG. 2.

FIG. 3 is a cross-sectional view taken along line III-III of FIG. 2. As illustrated in FIG. 3, the interconnects 41a to 41f of the metal interconnect layer M1 are connected to the local interconnects 45a to 45g through the contacts 43. The contacts 43 are formed together with the interconnects 41a to 41f of the metal interconnect layer M1 using a dual-damascene process. The contacts 43 may be formed separately from the interconnects 41a to 41f of the metal interconnect layer M1. The interconnects 41a to 41f of the metal interconnect layer M1 are made of, e.g., Cu, and have a surface on which a barrier metal 48 including, e.g., tantalum or tantalum nitride is formed. The local interconnects 45a to 45g are made of, e.g., tungsten, and have a surface on which a glue film 47 including, e.g., titanium or titanium nitride is formed. The local interconnects 45a to 45g may be made of cobalt. In this case, the glue film 47 may be omitted. The pads 21 to 26 have a surface on which a silicide film 49 made of, e.g., nickel or cobalt is formed.

Interlayer insulating films 46a and 46b are each, e.g., a silicon oxide film. An interlayer insulating film 46c is a low dielectric constant film such as SiOC or a porous film. The interlayer insulating film 46c may have a multilayer structure including two or more layers.

The gate electrodes 31p, 31n, 32p, and 32n are made of, e.g., polysilicon. The gate electrodes 31p, 31n, 32p, and 32n may be made of a material including a metal such as titanium nitride. A gate insulating film is, e.g., a silicon oxide film, and is formed by, e.g., thermal oxidation. The gate insulating film may be formed of an oxide of hafnium, zirconium, lanthanum, yttrium, aluminum, titanium, or tantalum.

As can be seen from the cross-sectional view of FIG. 3, in the n-type transistor area NA, the lower surfaces of the pads 24, 25, 26 are below those of the nanowires 13, 14. The upper surfaces of the nanowires 13 and 14 are at the same height as those of the pads 24, 25, 26. The gate electrodes 31n and 32n surround the periphery of the nanowires 13, 14, respectively. Similarly, in the p-type transistor area PA, the lower surfaces of the pads 21, 22, 23 are below those of the nanowires 11, 12. The upper surfaces of the nanowires 11, 12 are at the same height as those of the pads 21, 22, 23. The gate electrodes 31p and 32p surround the periphery of the nanowires 11, 12, respectively. That is to say, all of upper, lower, and both side surfaces of a channel region of each of the nanowires 11, 12, 13, 14 are surrounded by an associated one of the gate electrodes 31p, 32p, 31n, and 32n through the associated insulating film. The upper surfaces of the nanowires 13, 14 may be below the upper surfaces of the pads 24, 25, 26. The upper surfaces of the nanowires 11, 12 may be below the upper surfaces of the pads 21, 22, 23. A buried oxide (BOX) may be formed on the upper surface of the substrate.

In the layout of FIG. 2, the gate lines 31 and 32 and the dummy gate lines 35, 36, 61, and 65 are arranged at an equal pitch Pg in the X direction. The cell width (the dimension in the X direction) of the standard cell C1 is three times the gate pitch Pg, i.e., (Pg×3), whereas the cell width of the standard cell C2 is double the gate pitch Pg, i.e., (Pg×2).

In the layout of FIG. 2, the pads and the dummy pads are arranged at an equal pitch Pp in the X direction. That is to say, in the p-type transistor area PA, the pads 21, 22, 23 and the dummy pads 51, 52 are arranged at the pitch Pp, whereas in the n-type transistor area NA, the pads 24, 25, 26 and the dummy pads 53, 54 are arranged at the pitch Pp. The pitch Pg of the gate lines and the pitch Pp of the pads are equal. That is to say, the following relation is satisfied:

$$Pp=Pg$$

The pads and the dummy pads are all equal in a pad width Wp as a dimension in the X direction, and are all equal in a pad height Hp as a dimension in the Y direction. Further, in the p-type transistor area PA, associated ones of the pads 21, 22, 23 and the dummy pads 51, 52 have the same position in the Y direction, whereas in the n-type transistor area NA, associated ones of the pads 24, 25, 26 and the dummy pads 53, 54 have the same position in the Y direction.

In accordance with the above configuration, the standard cell C2 as the filler cell is disposed adjacent to the standard cell C1 as the logical cell. The standard cell C1 includes the nanowire FETs P11, P12, N11, and N12 each including the associated group of the nanowires 11, 12, 13, 14 and the associated groups of the pads 21, 22, 23, 24, 25, 26, whereas the standard cell C2 includes the groups of the dummy pads 51, 52, 53, 54. The standard cell C2 including the groups of dummy pads 51, . . . , allows the pads 21, . . . and the dummy pads 51, . . . to be regularly arranged in the standard cells C1 and C2. That is to say, the filler cell including the dummy pads allows the pads and the dummy pads to be regularly arranged. This can reduce process-induced variations in the semiconductor integrated circuit device, and improve yield.

The distance from the pads 23, 26 of the standard cell C1 to adjacent pads is determined to be a certain value due to the dummy pads 51 and 53 present in the standard cell C2. That is to say, the filler cell including the dummy pads allows the distance from pads closest to the cell end of the logical cell to adjacent pads to be determined to be a certain value. This improves the accuracy of estimating performance of the nanowire FETs.

Although in the above configuration the pads and the dummy pads are arranged at the same pitch Pp in the X direction, this is a non-limiting example. Although the pads and the dummy pads are all equal in the pad width Wp as a dimension in the X direction, and are all equal in the pad height Hp as a dimension in the Y direction, this is a non-limiting example. In the p-type transistor area PA, associated ones of the pads and the dummy pads has the same position in the Y direction, whereas in the n-type transistor area NA, associated ones of the pads and the dummy pads have the same position in the Y direction. However, this is a non-limiting example.

FIGS. 4A to 4C are plan views of filler cells having different cell widths. In the drawings, FIG. 4A shows a filler cell having a cell width equal to the gate pitch, FIG. 4B shows a filler cell having a cell width that is three times the gate pitch, and FIG. 4C is a filler cell having a cell width that is eight times the gate pitch. Just like the standard cell C2 illustrated in FIG. 2, the filler cells illustrated in FIGS. 4A to 4C each include dummy pads 50 and dummy gate lines 60. Although in FIG. 2 the standard cell C2 as the filler cell has a cell width that is double the gate pitch, filler cells having a different cell width such as those illustrated in FIGS. 4A to 4C may be disposed in accordance with the size of space between the logical cells.

Variation No. 1 of Filler Cell

Figure 5:
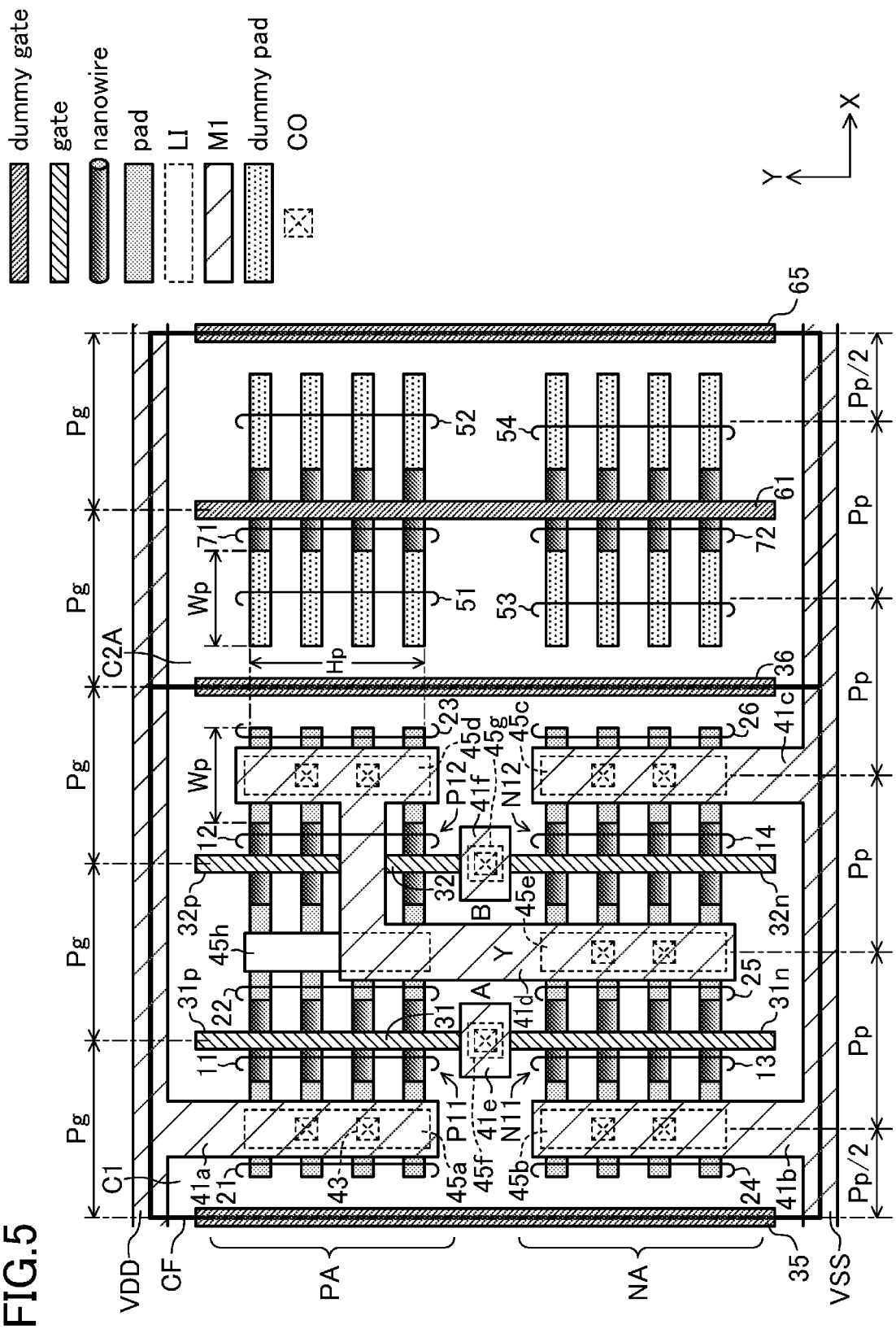
FIG. 5 is a plan view of another layout configuration of the standard cells in the embodiment.

FIG. 5 is a plan view of a variation of the layout configuration illustrated in FIG. 2. In FIG. 5, in place of the standard cell C2 of FIG. 2, a standard cell C2A having a different configuration is disposed as the filler cell. In FIG. 5, components common to those of FIG. 2 are denoted by the same reference characters as those of FIG. 2, and a detailed description thereof may be omitted here.

A p-type transistor area PA of the standard cell C2A is provided with groups of dummy pads 51, 52, and an n-type transistor area NA thereof is provided with groups of dummy pads 53, 54. Here, the groups of dummy pads 51, 52, 53, 54 each include four pads separately arranged in the Y direction. P-type impurities are introduced into the groups of dummy pads 51, 52 similarly to the groups of pads 21, 22, 23, whereas n-type impurities are introduced into the groups of dummy pads 53, 54 similarly to the groups of pads 24, 25, 26. The dummy gate line 61 extending in the Y direction is disposed between the groups of dummy pads 51, 53 and the groups of dummy pads 52, 54. The dummy gate line 65 extending in the Y direction is disposed on a side of the standard cell C2A remote from the standard cell C1.

The standard cell C2A is provided with groups of nanowires 71, 72. The nanowires 71 extend in the X direction between the group of dummy pads 51 and the group of dummy pads 52, and are parallelly arranged. The nanowires 72 extend in the X direction between the group of dummy pads 53 and the group of dummy pads 54, and are parallelly arranged. Here, the groups of nanowires 71, 72 each include four nanowires arranged in the Y direction, further each include two nanowires in the vertical direction, i.e., the direction perpendicular to the substrate, and each include eight nanowires in total. Each of the nanowires 71, 72 has a cylindrical shape, extends horizontally above the substrate, i.e., parallel to the substrate, and is comprised of, e.g., silicon. The arrangement pitch in the Y direction of the nanowires 71, 72 is equal to the arrangement pitch in the Y direction of the nanowires 11, 12, 13, 14 of the standard cell C1. The nanowires 71 are aligned with the associated nanowires 11, 12 of the standard cell C1 in the X direction, whereas the nanowires 72 are aligned with the associated nanowires 13, 14 of the standard cell C1 in the X direction.

The number of each of the groups of the nanowires 71, 72 is not limited to eight, and may be different from the number of each of the groups of the nanowires 11, 12, 13, 14 of the standard cell C1. The arrangement pitch in the Y direction of the nanowires 71, 72 is not necessarily equal to that of the nanowires 11, 12, 13, 14 of the standard cell C1, and the nanowires 71, 72 are not necessarily aligned with the associated nanowires 11, 12, 13, 14 in the X direction.

Variation No. 2 of Filler Cell

Figure 6:
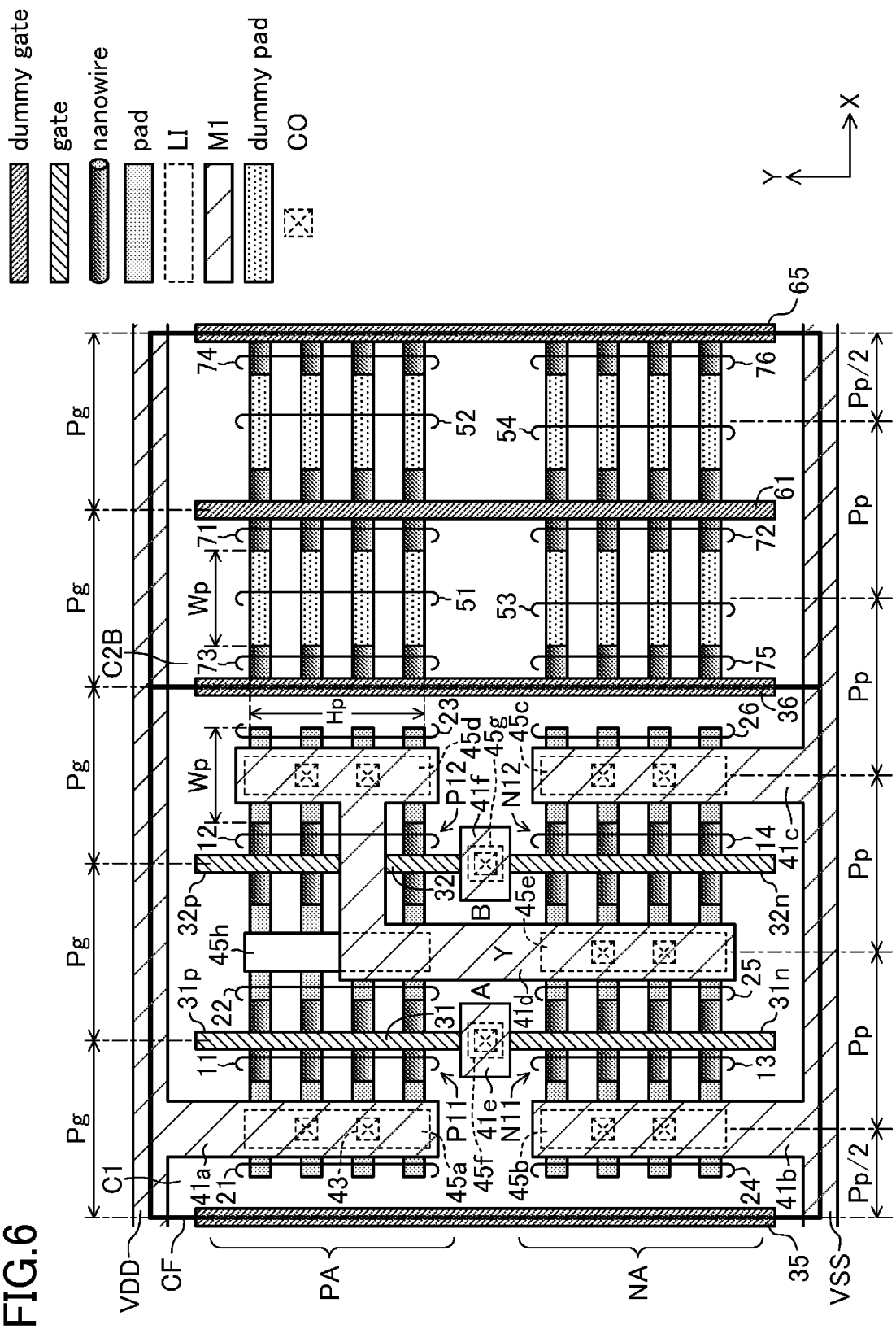
FIG. 6 is a plan view of still another layout configuration of the standard cells in the embodiment.

FIG. 6 is a plan view of a variation of the layout configuration illustrated in FIG. 2. In FIG. 6, in place of the standard cell C2 of FIG. 2, a standard cell C2B having a different configuration is disposed as the filler cell. Components common to those of FIG. 2 are denoted by the same reference characters as those of FIG. 2, and a detailed description thereof may be omitted here.

A p-type transistor area PA of the standard cell C2B is provided with groups of dummy pads 51, 52, and an n-type transistor area NA thereof is provided with groups of dummy pads 53, 54. Here, the groups of dummy pads 51, 52, 53, 54 each include four pads separately arranged in the Y direction. P-type impurities are introduced into the groups of dummy pads 51, 52 similarly to the groups of pads 21, 22, 23, whereas n-type impurities are introduced into the groups of dummy pads 53, 54 similarly to the groups of pads 24, 25, 26. A dummy gate line 61 extending in the Y direction is disposed between the groups of dummy pads 51, 53 and the groups of dummy pads 52, 54. A dummy gate line 65 extending in the Y direction is disposed on a side of the standard cell C2B remote from the standard cell C1.

The standard cell C2B is provided with groups of nanowires 71, 72. The nanowires 71 extend in the X direction between the group of dummy pads 51 and the group of dummy pads 52, and are parallelly arranged. The nanowires 72 extend in the X direction between the group of dummy pads 53 and the group of dummy pads 54, and are parallelly arranged. Further, the standard cell C2B is provided with groups of nanowires 73, 74, 75, 76. The nanowires 73 extend in the X direction between the dummy gate line 36 and the group of dummy pads 51, and are parallelly arranged. The nanowires 74 extend in the X direction between the dummy gate line 65 and the group of dummy pads 52, and are parallelly arranged. The nanowires 75 extend in the X direction between the group of dummy pads 53 and the dummy gate line 36, and are parallelly arranged. The nanowires 76 extend in the X direction between the group of dummy pads 54 and the dummy gate line 65, and are parallelly arranged. Here, the groups of nanowires 71, 72, 73, 74, 75, 76 each include four nanowires arranged in the Y direction, further each include two nanowires in the vertical direction, i.e., the direction perpendicular to the substrate, and each include eight nanowires in total. Each of the nanowires 71, 72, 73, 74, 75, 76 has a cylindrical shape, extends horizontally above the substrate, i.e., parallel to the substrate, and is comprised of, e.g., silicon. The arrangement pitch in the Y direction of the nanowires 71, 72, 73, 74, 75, 76 is equal to the arrangement pitch in the Y direction of the nanowires 11, 12, 13, 14 of the standard cell C1. The nanowires 71, 73, 74 are aligned with the associated nanowires 11, 12 of the standard cell C1 in the X direction, whereas the nanowires 72, 75, 76 are aligned with the associated nanowires 13, 14 of the standard cell C1 in the X direction.

The number of each of the groups of the nanowires 71, 72, 73, 74, 75, 76 is not limited to eight, and may be different from the number of each of the groups of the nanowires 11, 12, 13, 14 of the standard cell C1. The arrangement pitch in the Y direction of the nanowires 71, 72, 73, 74, 75, 76 is not necessarily equal to that of the nanowires 11, 12, 13, 14 of the standard cell C1, and the nanowires 71, 72, 73, 74, 75, 76 are not necessarily aligned with the associated nanowires 11, 12, 13, 14 in the X direction.

The standard cell C2A illustrated in FIG. 5 and the standard cell C2B illustrated in FIG. 6 may also vary in cell width as shown in FIG. 4.

Configuration of Cell-Row-Terminating Cell

Figure 7:
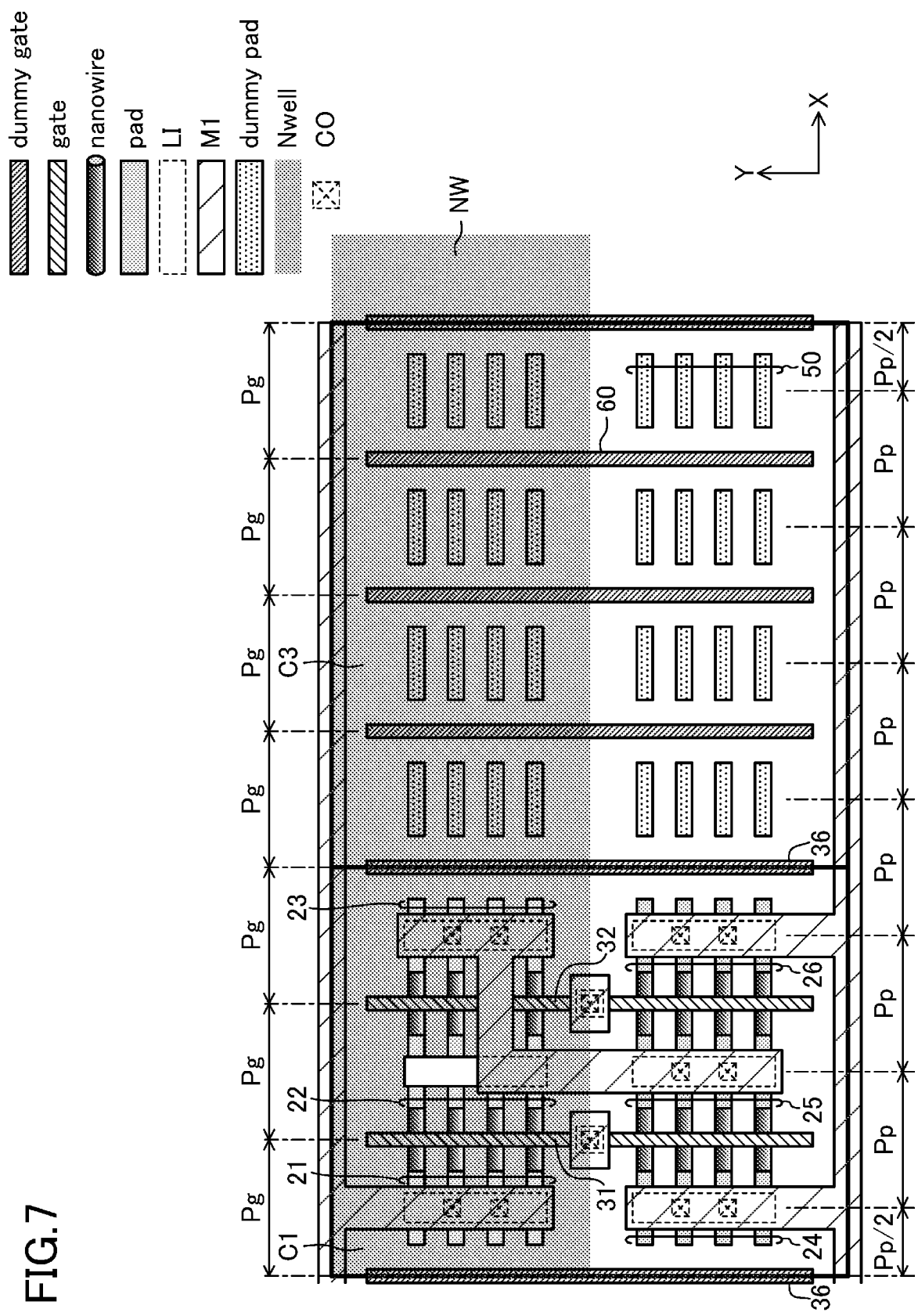
FIG. 7 is a plan view of yet another layout configuration of the standard cells in the embodiment.

FIG. 7 is an enlarged view of a portion W2 of FIG. 1, and is a plan view of a layout configuration of the cell-row-terminating cell in the present embodiment. In FIG. 7, components common to those of FIG. 2 are denoted by the same reference characters as those of FIG. 2, and a detailed description thereof may be omitted here. In FIG. 7, a standard cell C1 includes nanowire FETs and has a logical function (here, 2-input NOR). The configuration of the standard cell C1 is similar to that of the standard cell C1 of FIG. 2.

A standard cell C3 is a cell-row-terminating cell having no logical function, and is disposed adjacent to the standard cell C1 in the X direction. Arranging the standard cell C3 allows an N well region NW to be sufficiently extended in the X direction. With this configuration, the transistors (the nanowire FETs) of the standard cell C1 are located away from a well end, and the transistors near the well end can be prevented from having varying characteristics.

The standard cell C3 is provided with groups of dummy pads 50 and dummy gate lines 60 just like the standard cell C2 of FIG. 2. Here, the groups of dummy pads 50 each include four pads separately arranged in the Y direction. The dummy pads 50 are arranged at the pitch Pp equal to that of the pads 21, 22, 23, 24, 25, 26 of the standard cell C1 in the X direction. The dummy gate lines 60 are arranged at the pitch Pg equal to that of the gate lines 31 and 32 and the dummy gate lines 35 and 36 of the standard cell C1 in the X direction. The cell width of the standard cell C3 is four times the gate pitch Pg, i.e., (Pg×4).

The cell-row-terminating cell including the dummy pads can provide an effect similar to that obtained when the filler cell includes the dummy pads. That is to say, the pads including the dummy pads are regularly arranged, thus reducing process-induced variations in the semiconductor integrated circuit device and improving yield. In addition, the distance from pads closest to the cell end of the logical cell to adjacent pads can be determined to be a certain value. This improves the accuracy of estimating performance of the nanowire FETs.

In the configuration of FIG. 7, the cell width of the standard cell C3 is four times the gate pitch Pg. However, the cell width of the cell-row-terminating cell is not limited to this example, and the cell-row-terminating cell with various cell widths may be disposed similarly to the variations of the filler cell illustrated in FIG. 4. Although in the configuration of FIG. 7 the cell-row-terminating cell is disposed at the right end in the drawing of the cell row CR, a similar cell-row-terminating cell may be disposed at the left end in the drawing.

Similarly to the variations of the filler cell described above, a variation of the cell-row-terminating cell may also be used. Nanowires extending in the X direction may be provided between the dummy pads as in, e.g., the standard cell C2A of FIG. 5. Alternatively, nanowires extending in the X direction may be provided between the dummy gate line provided at the cell end and the dummy pads adjacent thereto as in the standard cell C2B of FIG. 6.

Capacitance Cell Including Dummy Pads

The dummy pads described above may be fixed to the power supply potential. This can prevent the dummy pads from being in an electrically floating state, and circuit operation can be made more stable. The dummy pads in the p-type transistor area may be fixed to VDD, whereas the dummy pads in the n-type transistor area may be fixed to VSS. With this configuration, a capacitance is generated between the dummy pads, and the filler cell or the cell-row-terminating cell having these dummy pads functions as a capacitance cell, i.e., an inter-power supply decoupling capacitor. Consequently, power supply voltage can be stabilized.

Figure 8:
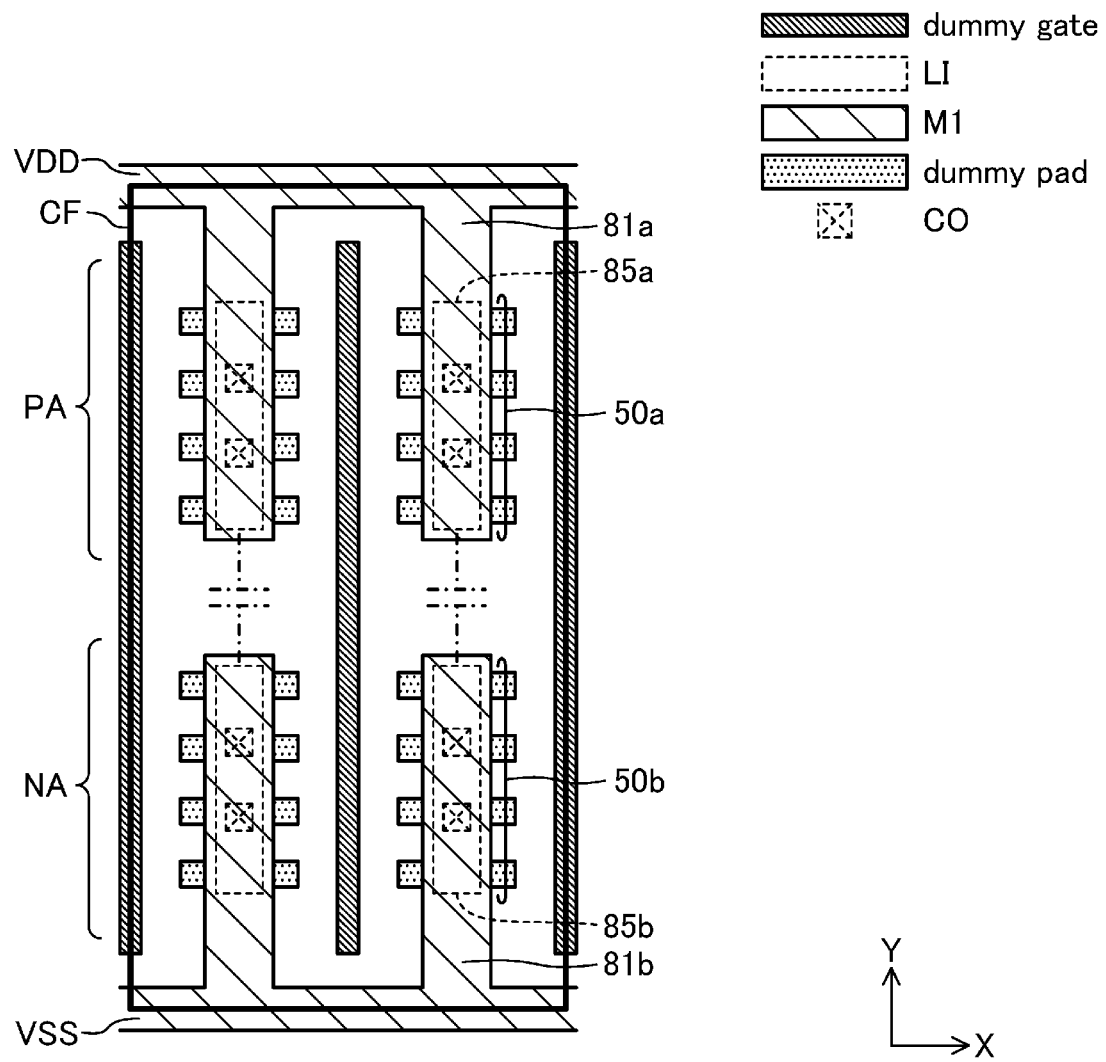
FIG. 8 is a plan view of a layout configuration of a capacitance cell including dummy pads.

FIG. 8 is a plan view of a layout configuration of a capacitance cell including dummy pads. FIG. 8 illustrates a filler cell having a cell width that is double the gate pitch as an example, which is disposed in place of, e.g., the standard cell C2 illustrated in FIG. 2 (the same for FIGS. 9A to 12B). In the configuration of FIG. 8, groups of dummy pads 50a provided in the p-type transistor area PA are each connected to the interconnect VDD through an interconnect 81a and a local interconnect 85a. Here, the groups of dummy pads 50a each include four pads separately arranged in the Y direction. Groups of dummy pads 50b provided in the n-type transistor area NA are each connected to the interconnect VSS through an interconnect 81b and a local interconnect 85b. Here, the groups of dummy pads 50b each include four pads separately arranged in the Y direction. That is to say, the dummy pads 50a as first dummy pads are fixed to VDD as a first power supply potential, whereas the dummy pads 50b as second dummy pads are fixed to VSS as a second power supply potential. With this configuration, a capacitance is generated between each of the groups of dummy pads 50a and the associated group of dummy pads 50b (as indicated by the dot-and-dash line), and the filler cell of FIG. 8 functions as a capacitance cell.

Figure 9A:
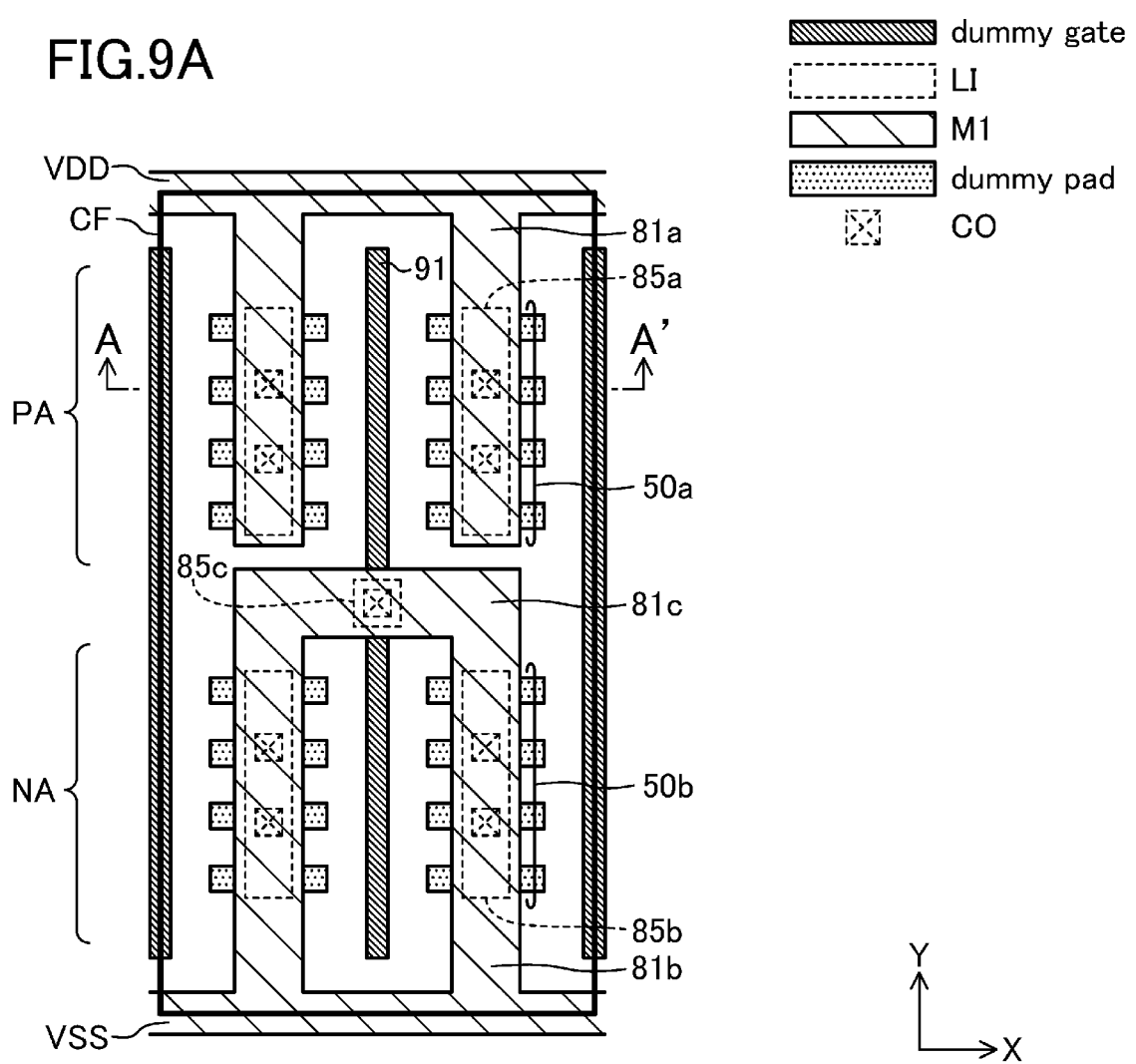
FIGS. 9A and 9B are diagrams of another configuration example of the capacitance cell including the dummy pads.
Figure 9B:
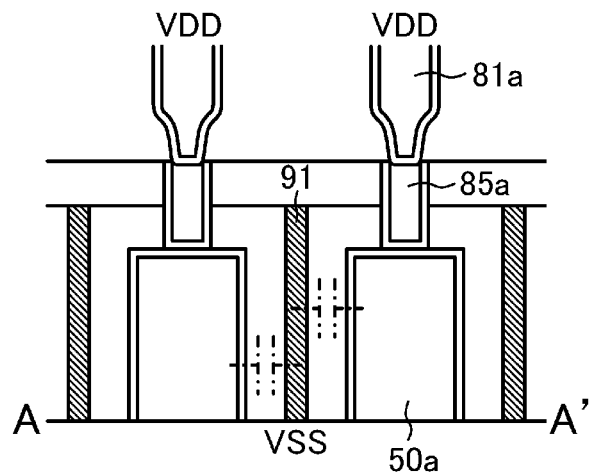

FIGS. 9A and 9B illustrate another configuration example of the capacitance cell including the dummy pads: FIG. 9A is a plan view of a layout configuration of the capacitance cell; and FIG. 9B is a cross-sectional view taken along line A-A' of FIG. 9A. In the configuration of FIGS. 9A and 9B, similarly to the configuration of FIG. 8, groups of dummy pads 50a provided in the p-type transistor area PA are each connected to the interconnect VDD through the interconnect 81a and the local interconnect 85a, whereas groups of dummy pads 50b provided in the n-type transistor area NA are each connected to the interconnect VSS through the interconnect 81b and the local interconnect 85b. Further, a dummy gate line 91 is connected to the groups of dummy pads 50b through an interconnect 81c and a local interconnect 85c. That is to say, the dummy gate line 91 extending in the Y direction between the two groups of dummy pads 50a is fixed to VSS.

With this configuration, a capacitance is generated between each of the groups of the dummy pads 50a and the dummy gate line 91 (as indicated by the dot-and-dash line in FIG. 9B). Consequently, a capacitance cell having a larger capacitance value than that of the configuration of FIG. 8 can be achieved. The capacitor between the group of dummy pads 50a and the dummy gate line 91 has a higher breakdown voltage than a capacitor via a gate oxide film.

Figure 10:
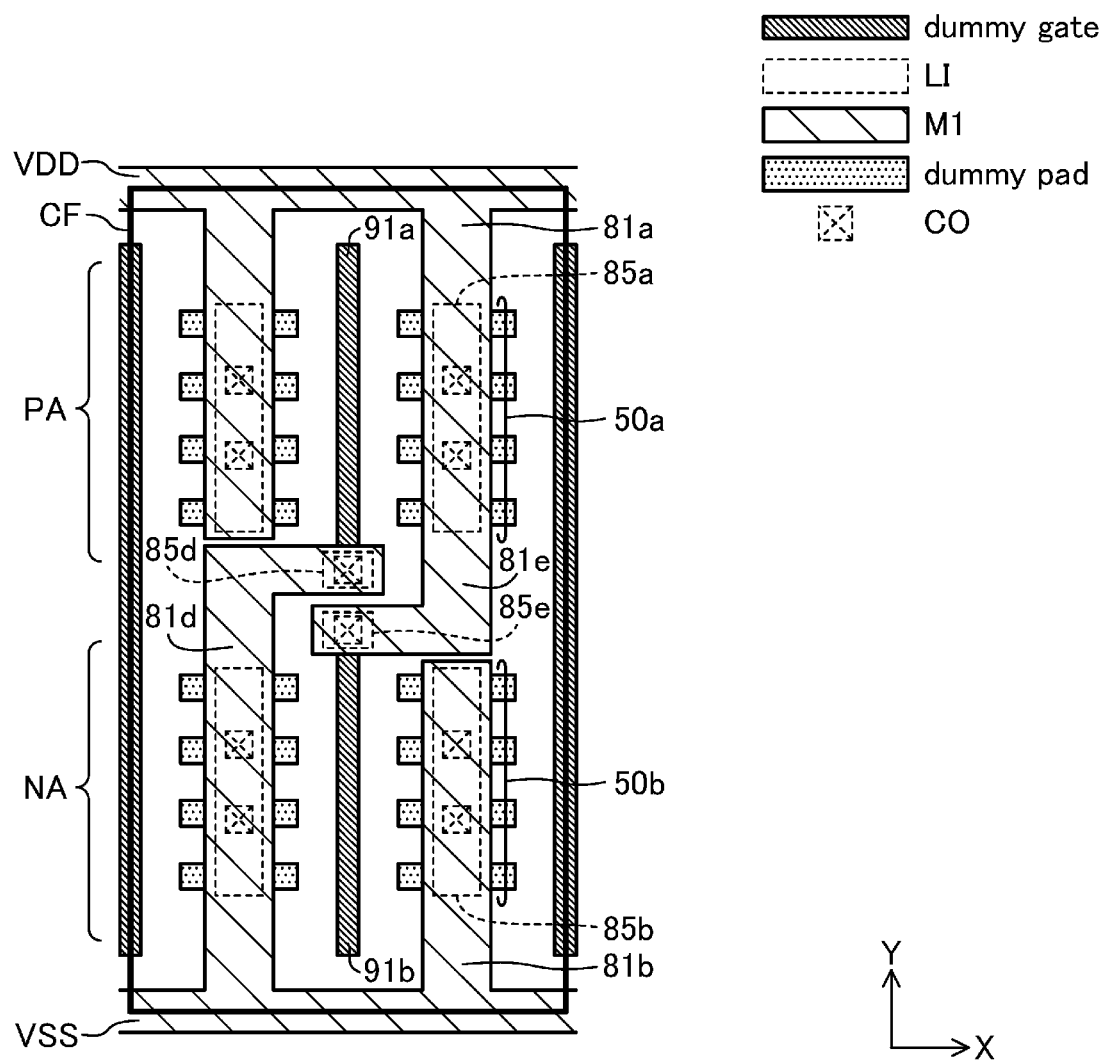
FIG. 10 is a plan view of still another layout configuration of the capacitance cell including the dummy pads.

FIG. 10 is a plan view of another example of the layout configuration of the capacitance cell including the dummy pads. In the configuration of FIG. 10, similarly to the configuration of FIG. 8, groups of dummy pads 50a provided in the p-type transistor area PA are each connected to the interconnect VDD through the interconnect 81a and the local interconnect 85a, whereas groups of dummy pads 50b provided in the n-type transistor area NA are each connected to the interconnect VSS through the interconnect 81b and the local interconnect 85b. Further, in the configuration of FIG. 10, dummy gate lines 91a and 91b that are on the same line extending in the Y direction, and are separated between the p-type transistor area PA and the n-type transistor area NA are disposed. The dummy gate line 91a is connected to one of the groups of dummy pads 50b through an interconnect 81d and a local interconnect 85d. That is to say, the dummy gate line 91a as a first dummy gate line is fixed to VSS. The dummy gate line 91b is connected to one of the groups of dummy pads 50a through an interconnect 81e and a local interconnect 85e. That is to say, the dummy gate line 91b as a second dummy gate line is fixed to VDD. The dummy gate lines 91a and 91b are not necessarily disposed on the same line.

With this configuration, a capacitance is generated between the group of dummy pads 50a and the dummy gate line 91a, and a capacitance is generated between the group of dummy pads 50b and the dummy gate line 91b. That is to say, in each of the p-type transistor area PA and the n-type transistor area NA, a large capacitor with a high breakdown voltage is formed. Consequently, a capacitance cell having a larger capacitance value than that of the configuration of FIG. 9 can be achieved.

Figure 11A:
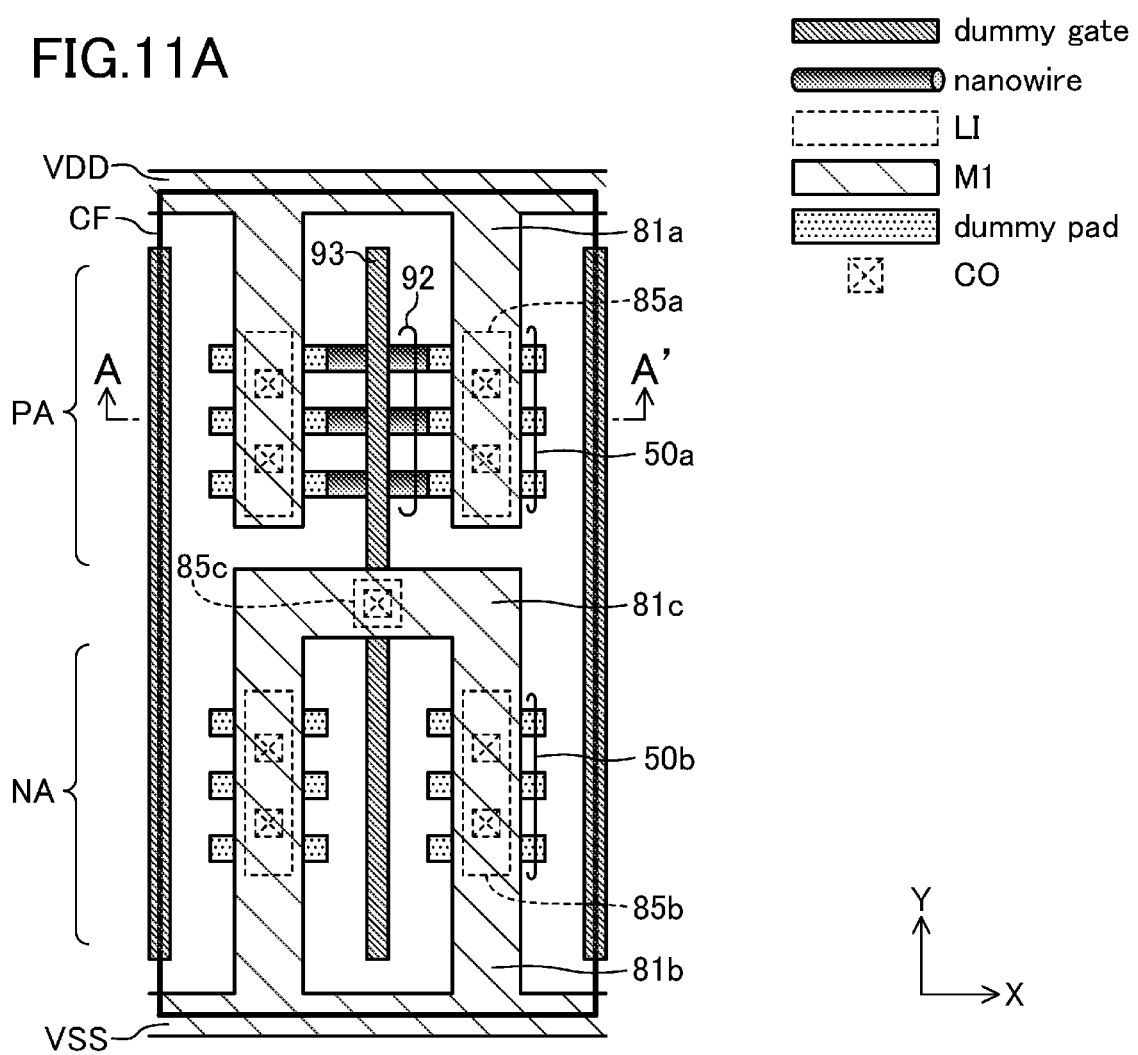
FIGS. 11A and 11B illustrate yet another configuration example of the capacitance cell including the dummy pads.
Figure 11B:
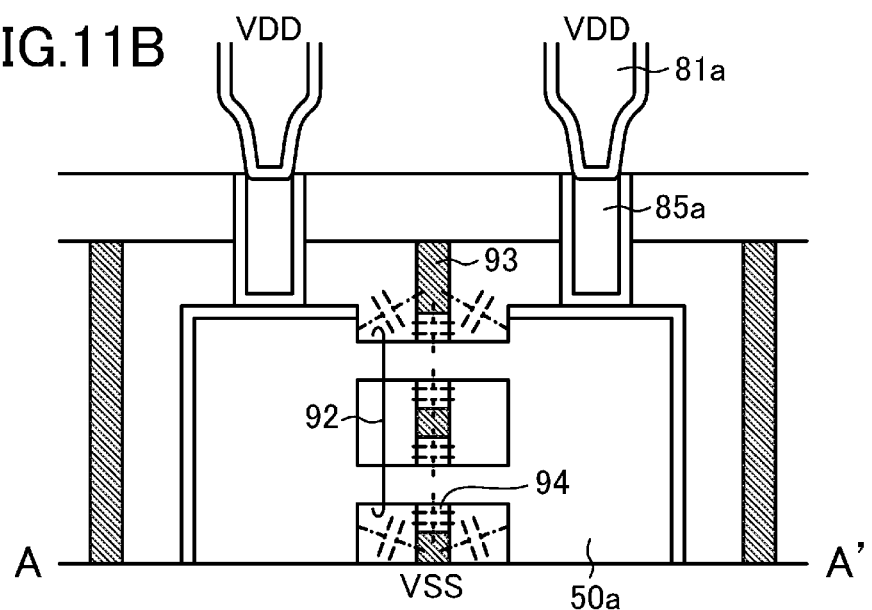

FIGS. 11A and 11B illustrate another configuration example of the capacitance cell including the dummy pads: FIG. 11A is a plan view of a layout configuration of the capacitance cell; and FIG. 11B is a cross-sectional view taken along line A-A' of FIG. 11A. It should be noted that FIG. 11B is enlarged for easy understanding. In the configuration of FIGS. 11A and 11B, similarly to the configuration of FIGS. 9A and 9B, groups of dummy pads 50a provided in the p-type transistor area PA are each connected to the interconnect VDD through the interconnect 81a and the local interconnect 85a, whereas groups of dummy pads 50b provided in the n-type transistor area NA are each connected to the interconnect VSS through the interconnect 81b and the local interconnect 85b. A group of a plurality of nanowires 92 extending in parallel in the X direction is provided between the groups of dummy pads 50a. Here, the group of nanowires 92 includes three nanowires arranged in the Y direction, includes two nanowires in the vertical direction, i.e., the direction perpendicular to the substrate, and include six nanowires in total. A gate line 93 extending in the Y direction surrounds the nanowires 92 via a gate insulating film 94. The gate line 93 is connected to the groups of dummy pads 50b through the interconnect 81c and the local interconnect 85c. That is to say, the gate line 93 is fixed to VSS.

With this configuration, capacitances are generated between the dummy pads 50a and the gate line 93 and between the nanowires 92 and the gate line 93 (as indicated by the dot-and-dash line in FIG. 11B). Consequently, a capacitance cell having a larger capacitance value than that of the configuration of FIGS. 9A and 9B can be achieved. Although in the configuration of FIGS. 9A and 9B the number of the nanowires 92 is six, this is a non-limiting example.

In the configuration in which the gate lines are separated between the p-type transistor area PA and the n-type transistor area NA as in FIG. 10, nanowires may be provided between the dummy pads 50a and between the dummy pads 50b. With this configuration, in each of the p-type transistor area PA and the n-type transistor area NA, a capacitor via a gate insulating film is formed.

FIGS. 12A and 12B illustrate another configuration example of the capacitance cell including the dummy pads. In FIGS. 12A and 12B, FIG. 12A omits the local interconnect 85b from the configuration of FIG. 9A, and FIG. 12B omits the local interconnect 85b from the configuration of FIG. 11A. In the configurations of FIGS. 9A, 9B, 11A, and 11B, in the n-type transistor area NA, all the dummy pads 50b, the dummy gate line 91, and the gate line 93 are fixed to VSS, and thus no capacitor is formed. Consequently, as illustrated in FIGS. 12A and 12B, the local interconnect 85b that connects the dummy pads 50b and the interconnect 81b together may be omitted.

Although FIGS. 8 to 12 illustrate the configuration of the capacitance cell with the filler cell having a cell width that is double the gate pitch as an example, the cell-row-terminating cell having dummy pads can similarly form a capacitance cell. The filler cell and the cell-row-terminating cell having another cell width can also similarly form a capacitance cell.

Figure 13A:
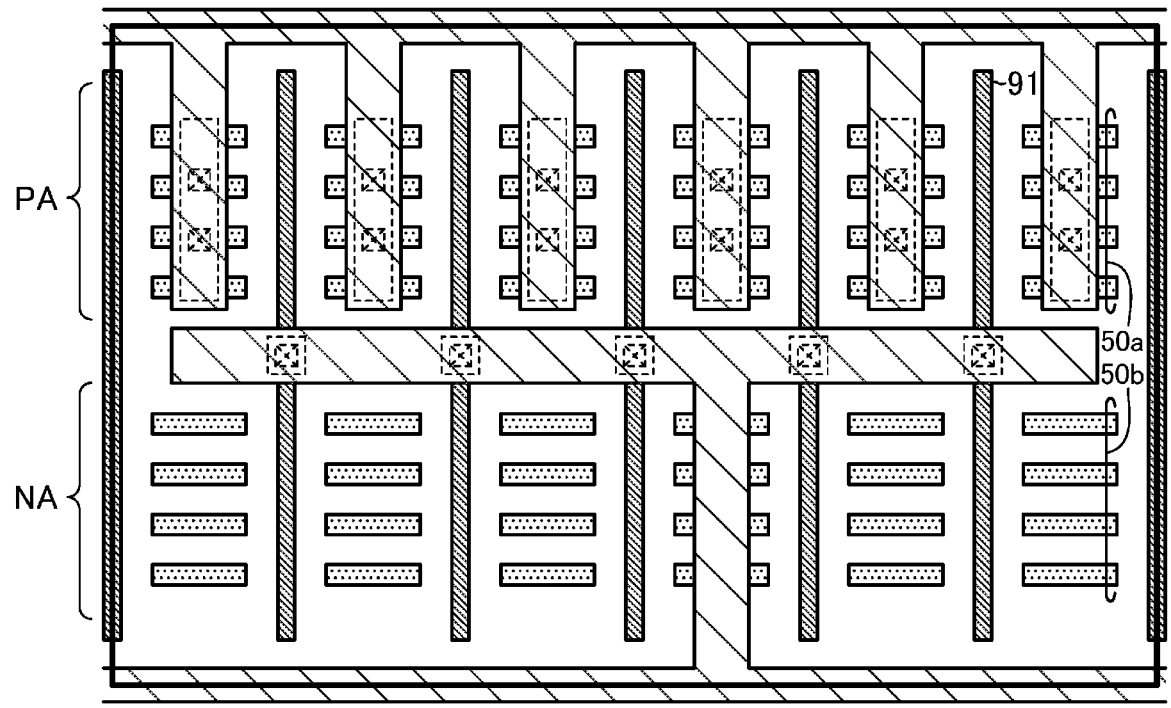
FIGS. 13A and 13B are plan views of variations of the capacitance cell of FIGS. 12A and 12B having a greater cell width than the capacitance cell of FIGS. 12A and 12B.
Figure 13B:
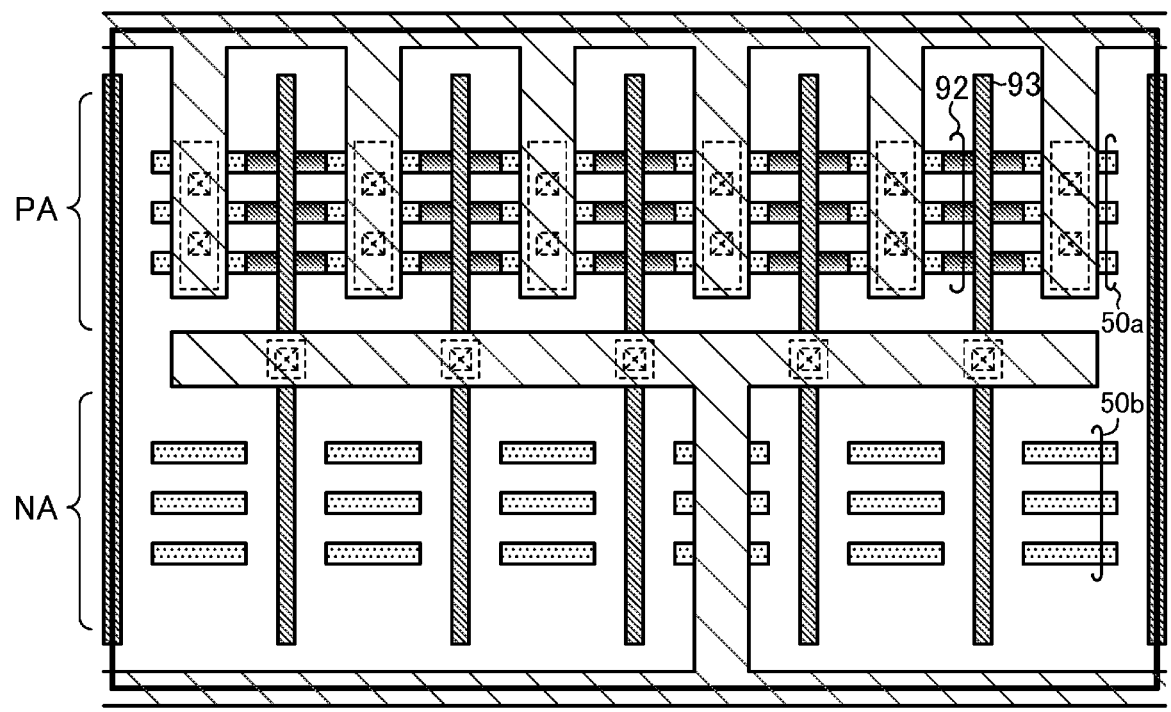

FIGS. 13A and 13B illustrate variations of the capacitance cell of FIGS. 12A and 12B having a greater cell width than the capacitance cell of FIGS. 12A and 12B. In FIG. 13A, the cell width of the capacitance cell of FIG. 12A is increased to six times the gate pitch. In FIG. 13B, the cell width of the capacitance cell of FIG. 12B is increased to six times the gate pitch.

In the foregoing description, the nanowire is cylindrical. However, this shape is a non-limiting example. For example, the cross-sectional shape of the nanowire may be oval or elliptical, or the nanowire may be in the shape of a prism such as a rectangular prism.

Figure 14:
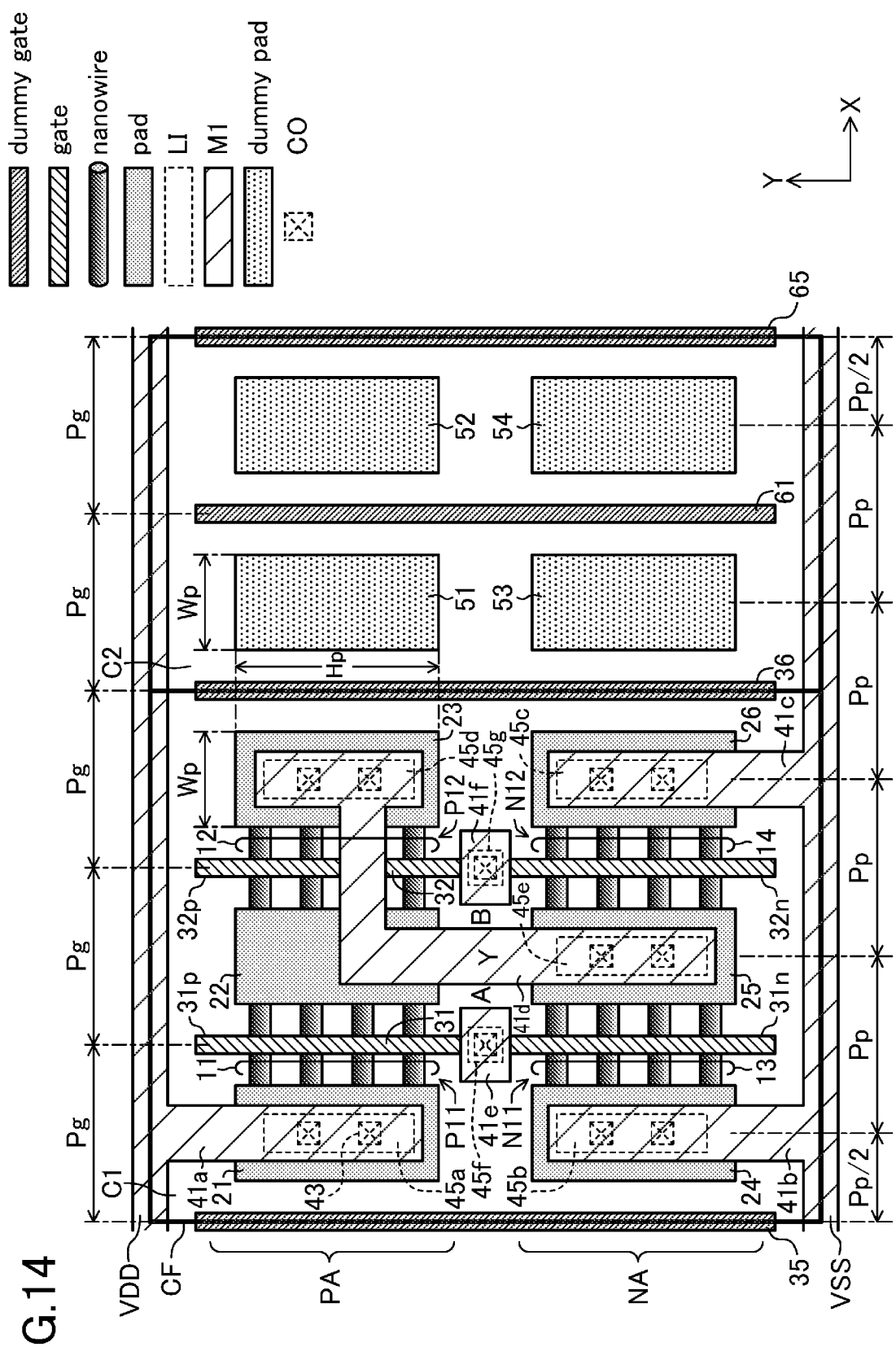
FIG. 14 shows a variation of the layout configuration of the standard cells of FIG. 2.

In the foregoing description, in the nanowire FET, the pads are separate from the nanowires arranged in the Y direction. However, the pads may be integrated with the nanowires arranged in the Y direction. FIG. 14 shows a variation of the layout configuration of FIG. 2. In FIG. 14, pads 21, 22, 23, 24, 25, 26 are each integrated with associated ones of the groups of nanowires 11, 12, 13, 14 each including four nanowires arranged in the Y direction. Dummy pads 51, 52, 53, 54 are each integral.

In the foregoing description, in the standard cell, the widths of the pads are all the same, and the intervals between the pads are all the same. However, this is a non-limiting example. For example, the standard cell may include pads having different widths, and the pads may be arranged at different intervals. In this case, arranging the pads at an equal pitch achieves a regular layout pattern of the pads. The pads in the p-type transistor region and the associated pads in the n-type transistor region do not have to have the same position in the X direction. However, they are preferably aligned with one another.

In the foregoing description, the pitch between the gate lines is equal to the pitch between the pads. However, this is a non-limiting example. The gate line extends linearly along the Y direction in the p-type transistor region and the n-type transistor region. However, this is a non-limiting example.

The present disclosure provides a layout configuration of a semiconductor integrated circuit device including a nanowire FET, the layout configuration being effective for making manufacturing the device easy, and is useful for improving performance of the semiconductor integrated circuit device.

What is claimed is:

1. A semiconductor integrated circuit device, comprising:
   a first standard cell including a first nanowire field effect transistor (FET) in a first type transistor area and a second nanowire FET in a second type transistor area and having a logical function; and
   a second standard cell disposed adjacent to the first standard cell in a first direction,
   wherein the first nanowire FET includes:
      a first pad and a second pad,
      a plurality of first nanowires extending in the first direction and each connected to the first and second pads,
   the second nanowire FET includes:
      a third pad and a fourth pad,
      a plurality of second nanowires extending in the first direction and each connected to the third and fourth pads, and
   the second standard cell includes:
      a first dummy pad and a second dummy pad in the first type transistor area,
      a plurality of third nanowires extending in the first direction and each connected to the first and second dummy pads,
      a third dummy pad and a fourth dummy pad in the second type transistor area, and
      a plurality of fourth nanowires extending in the first direction and each connected to the third and fourth dummy pads,
   the first, second, third and fourth dummy pads, the plurality of third nanowires and the plurality of fourth nanowires having no contribution to a logical function of a circuit, and
   the first pad and the second pad are arranged at a first pitch in the first direction, the third pad and the fourth pad are arranged at the first pitch in the first direction, the first dummy pad and the second dummy pad are arranged at the first pitch in the first direction, and the third dummy pad and the fourth dummy pad are arranged at the first pitch in the first direction.

2. The semiconductor integrated circuit device of claim 1, the first standard cell further comprising:
   a fifth pad, and
   a plurality of fifth nanowires extending in the first direction and each connected to the second and fifth pads,
   the second pad and the fifth pad are arranged at the first pitch in the first direction.

3. The semiconductor integrated circuit device of claim 1, the first standard cell further comprising a first gate line extending in a second direction perpendicular to the first direction and surrounding a periphery of the plurality of first nanowires, and a second gate line extending in the second direction and surrounding a periphery of the plurality of second nanowires.

4. The semiconductor integrated circuit device of claim 3, the plurality of first nanowires are arranged in a third direction perpendicular to the first and second direction, and the plurality of second nanowires are arranged in the third direction.

5. The semiconductor integrated circuit device of claim 3, the second standard cell further comprising a first dummy gate line extending in the second direction between the first dummy pad and the second dummy pad and a second dummy gate line extending in the second direction between the third dummy pad and the fourth dummy pad.

6. A semiconductor integrated circuit device, comprising:
   a first standard cell including a first nanowire field effect transistor (FET) in a first type transistor area and a second nanowire FET in a second type transistor area and having a logical function; and
   a cell-row-terminating cell disposed adjacent to the first standard cell in a first direction,
   wherein the first nanowire FET includes:
      a first pad and a second pad, and a plurality of first nanowires extending in the first direction and each connected to the first and second pads, the second nanowire FET includes:
a third pad and a fourth pad, and
a plurality of second nanowires extending in the first direction and each connected to the third and fourth pads, and the cell-row-terminating cell includes:
a first dummy pad and a second dummy pad in the first type transistor area,
a plurality of third nanowires extending in the first direction and each connected to the first and second dummy pads,
a third dummy pad and a fourth dummy pad in the second type transistor area, and
a plurality of fourth nanowires extending in the first direction and each connected to the third and fourth dummy pads, the first, second, third and fourth dummy pads, the plurality of third nanowires and the plurality of fourth nanowires having no contribution to a logical function of a circuit, and the first pad and the second pad are arranged at a first pitch in the first direction, the third pad and the fourth pad are arranged at the first pitch in the first direction, the first dummy pad and the second dummy pad are arranged at the first pitch in the first direction, and the third dummy pad and the fourth dummy pad are arranged at the first pitch in the first direction.

7. The semiconductor integrated circuit device of claim 6, the first standard cell further comprising:
a fifth pad, and
a plurality of fifth nanowires extending in the first direction and each connected to the second and fifth pads,
the second pad and the fifth pad are arranged at the first pitch in the first direction.

8. The semiconductor integrated circuit device of claim 6, the first standard cell further comprising a first gate line extending in a second direction perpendicular to the first direction and surrounding a periphery of the plurality of first nanowires, and a second gate line extending in the second direction and surrounding a periphery of the plurality of second nanowires.

9. The semiconductor integrated circuit device of claim 8, the plurality of first nanowires are arranged in a third direction perpendicular to the first and second direction, and the plurality of second nanowires are arranged in the third direction.

10. The semiconductor integrated circuit device of claim 8, the cell-row-terminating cell further comprising a first dummy gate line extending in the second direction between the first dummy pad and the second dummy pad and a second dummy gate line extending in the second direction between the third dummy pad and the fourth dummy pad.

11. A semiconductor integrated circuit device, comprising:
a first standard cell including a first nanowire field effect transistor (FET) in a first type transistor area and a second nanowire FET in a second type transistor area and having a logical function; and
a second standard cell disposed adjacent to the first standard cell in a first direction,
wherein the first nanowire FET includes:
a first pad and a second pad, and
a plurality of first nanowires extending in the first direction and each connected to the first and second pads, the second nanowire FET includes:
a third pad and a fourth pad, and
a plurality of second nanowires extending in the first direction and each connected to the third and fourth pads, and the second standard cell includes:
a first dummy pad and a second dummy pad in the first type transistor area,
a plurality of third nanowires extending in the first direction and each connected to the first and second dummy pads,
a third dummy pad and a fourth dummy pad in the second type transistor area, and
a plurality of fourth nanowires extending in the first direction and each connected to the third and fourth dummy pads, the first, second, third and fourth dummy pads, the plurality of third nanowires and the plurality of fourth nanowires having no contribution to a logical function of a circuit, and the first standard cell is supplied with first and second power supply potentials, and the first dummy pad is supplied with the first power supply potential.

12. The semiconductor integrated circuit device of claim 11, the first standard cell further comprising:
a fifth pad, and
a plurality of fifth nanowires extending in the first direction and each connected to the second and fifth pads,
the second pad and the fifth pad are arranged at the first pitch in the first direction.

13. The semiconductor integrated circuit device of claim 11, the first standard cell further comprising a first gate line extending in a second direction perpendicular to the first direction and surrounding a periphery of the plurality of first nanowires, and a second gate line extending in the second direction and surrounding a periphery of the plurality of second nanowires.

14. The semiconductor integrated circuit device of claim 13, the plurality of first nanowires are arranged in a third direction perpendicular to the first and second direction, and the plurality of second nanowires are arranged in the third direction.

15. The semiconductor integrated circuit device of claim 13, the second standard cell further comprising a first dummy gate line extending in the second direction between the first dummy pad and the second dummy pad and a second dummy gate line extending in the second direction between the third dummy pad and the fourth dummy pad.

16. The semiconductor integrated circuit device of claim 11, wherein the first pad and the second pad are arranged at a first pitch in the first direction, the third pad and the fourth pad are arranged at the first pitch in the first direction, the first dummy pad and the second dummy pad are arranged at the first pitch in the first direction, and the third dummy pad and the fourth dummy pad are arranged at the first pitch in the first direction.

17. The semiconductor integrated circuit device of claim 11, wherein the third dummy pad is supplied with the second power supply potential.

18. The semiconductor integrated circuit device of claim 15, wherein the first dummy gate line is supplied with the second power supply potential.

* * * * *